(12) United States Patent
Komada

(10) Patent No.: US 6,627,554 B1
(45) Date of Patent: Sep. 30, 2003

(54) SEMICONDUCTOR DEVICE MANUFACTURING METHOD

(75) Inventor: Daisuke Komada, Aichi (JP)

(73) Assignee: Fujitsu Limited, Kawasaki (JP)

( * ) Notice: Subject to any disclaimer, the term of this patent is extended or adjusted under 35 U.S.C. 154(b) by 0 days.

(21) Appl. No.: 09/537,430

(22) Filed: Mar. 27, 2000

(30) Foreign Application Priority Data

Jul. 15, 1999 (JP) ........................................... 11-201763

(51) Int. Cl.$^7$ ............................................. H01L 21/302
(52) U.S. Cl. ...................... 438/710; 438/643; 438/675; 438/700; 438/689; 438/707
(58) Field of Search ................. 438/643, 675, 438/700, 704, 706, 707, 718, 710, 906, 689

(56) References Cited

U.S. PATENT DOCUMENTS

| | | | | |
|---|---|---|---|---|
| 5,281,850 A | * | 1/1994 | Kanamori | 257/758 |
| 5,310,626 A | * | 5/1994 | Fernandes et al. | 430/327 |
| 5,667,630 A | * | 9/1997 | Lo | 438/653 |
| 5,741,626 A | * | 4/1998 | Jain et al. | 430/314 |
| 5,783,459 A | * | 7/1998 | Suzuki et al. | 437/194 |
| 5,811,022 A | * | 9/1998 | Savas et al. | 216/68 |
| 5,814,156 A | * | 9/1998 | Elliott et al. | 134/1 |
| 5,849,367 A | * | 12/1998 | Dixit et al. | 427/535 |
| 5,849,639 A | * | 12/1998 | Molloy et al. | 438/714 |
| 5,977,041 A | * | 11/1999 | Honda | 510/175 |
| 5,986,344 A | * | 11/1999 | Subramanion et al. | 257/760 |
| 6,150,723 A | * | 11/2000 | Harper et al. | 257/762 |
| 6,169,036 B1 | * | 1/2001 | Bhowmik et al. | 438/710 |
| 6,207,583 B1 | * | 3/2001 | Dunne et al. | 438/725 |

* cited by examiner

Primary Examiner—Matthew Smith
Assistant Examiner—Renzo N. Rocchegiani
(74) Attorney, Agent, or Firm—Armstrong, Westerman & Hattori, LLP

(57) ABSTRACT

A semiconductor device manufacturing method having a multi-layered wiring structure comprises the steps of forming an insulating film over a semiconductor substrate, coating resist on the insulating film, forming a wiring pattern window in the resist, forming a wiring recess by etching the insulating film via the window, removing the resist, removing a reaction product existing on the insulating film by exposing the insulating film to a plasma atmosphere using an inactive gas, and burying a metal film into the wiring recess to form a wiring.

18 Claims, 22 Drawing Sheets

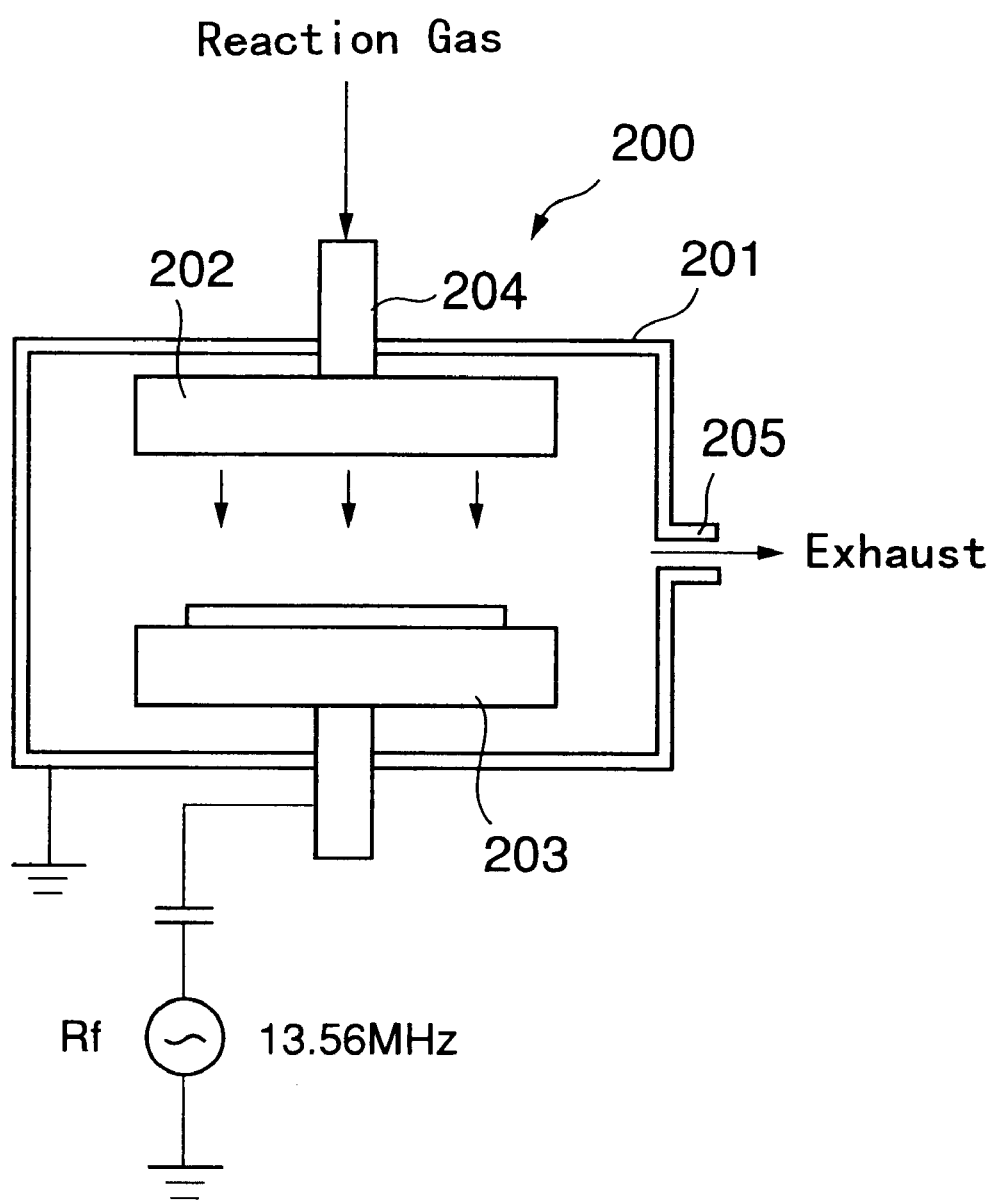

SEMICONDUCTOR DEVICE MANUFACTURING METHOD

BACKGROUND OF THE INVENTION

1. Field of the Invention

The present invention relates to a semiconductor device manufacturing method and, more particularly, a semiconductor device manufacturing method having a multi-layered wiring structure.

2. Description of the Prior Art

In the case that wirings in a semiconductor integrated circuit device are formed of aluminum or tungsten, the photolithography method is adopted as a method of patterning an aluminum film or a tungsten film. In other words, after a resist pattern is formed on the aluminum film or the tungsten film, such patterning is carried out by removing the aluminum film or the tungsten film being not covered with the resist pattern by virtue of the dry etching. Since products are adhered onto side walls of the wiring during the step of patterning the aluminum film or the tungsten film, normally such products are removed by alkali chemicals, etc.

As other material of the wiring, copper (Cu) which has a lower resistance than the aluminum or the tungsten is requested with the miniaturization of the semiconductor integrated circuit, but it is difficult to etch a copper film by virtue of the dry etching.

Therefore, the method of patterning the copper film by the photolithography method is not normally employed. The damascene method is employed to form the copper wiring pattern.

There are two ways as the damascene method, i.e., the single damascene method in which a via layer and a wiring layer are formed by independent steps, and the dual damascene method in which the via layer and the wiring layer are formed by the same steps. During the step of forming the wirings, both methods include the steps of forming recesses in an insulating film by the dry etching method and then burying a metal into the recesses. In this case, via material or wiring material employed in the damascene method are not always limited to the copper, and other metals may be employed.

However, according to the method of forming the wirings by virtue of the damascene method, sometimes thin-film like reaction product remains around the recesses in etching the insulating film to form the recesses, and such reaction product causes various problems.

Next, formation of the recesses by the single damascene method and generation of the reaction product will be explained hereunder.

First, as shown in FIG. 1A, a second interlayer insulating film 103 made of $SiO_2$ is formed on a first interlayer insulating film 101 in which a first via 102 made of tungsten, or the like is buried, and then a first copper wiring 104 is formed on the first via 102 and in the second interlayer insulating film 103 by the damascene method. In addition, a first silicon nitride film 105 and a third interlayer insulating film 106 made of $SiO_2$ are formed on the second interlayer insulating film 103, and then a second via 107 made of copper is formed in the first silicon nitride film 105 and the third interlayer insulating film 106 on the first copper wiring 104.

Then, a second silicon nitride film 108 for covering the second via 107 and the third interlayer insulating film 106, a fourth interlayer insulating film 109 made of $SiO_2$, and a reflection preventing film 110 made of silicon nitride are formed in sequence.

Then, resist 111 is coated on the reflection preventing film 110, and then a window 111a for forming the wiring is formed by exposing/developing this resist 111.

Next, as shown in FIG. 1B, when a wiring recess 112 is formed by etching the reflection preventing film 110 and the fourth interlayer insulating film 109 via the window 111a in the resist 111, reaction product 113 formed of silicon compound is adhered onto a side wall of the resist 111.

Then, when the washing of the resist 111 is carried out by using an oxygen containing gas, for example, a mixed gas of oxygen and nitrogen, silicon series reaction product 113 still remains in the neighborhood of the wiring recess 112, as shown in FIG. 1C.

If the reaction product 113 exists, a metal film is not well grown in burying a metal film such as copper, etc. into the wiring recess 112, and thus such metal film is ready to peel off.

Accordingly, a method of removing the reaction product by using a hydrofluoric acid (HF) after the resist has been removed, or removing the reaction product by introducing a fluorine compound gas in an oxygen gas in removing the resist is adopted. If $CF_4$ is used as the fluorine compound gas, normally such $CF_4$ is mixed in the range of 10 to 15 flow rate % relative to a total gas flow rate.

However, in recent such a tendency is increased that the increase in the interwiring capacitance becomes remarkable with the miniaturization of the semiconductor integrated circuit and thus an insulating film with a low dielectric constant is employed as the interlayer insulating film per se.

FSG (Fluoro-Silicate Glass) as such insulating film with the low dielectric constant has various problems in adhesiveness, posttreatment resistance, etching performance, etc. rather than other silicon compound films. Thus, the situation that the hydrofluoric acid and the fluorine compound gas, as described above, cannot be applied to the FSG is brought about.

As one of the problems, generation of unevenness on the side wall of the wiring recess or the side wall of the via hole may be pointed out. An example will be mentioned with reference to FIG. 2 hereunder.

First, as shown in FIG. 2A, the second interlayer insulating film 103 made of $SiO_2$ is formed on the first interlayer insulating film 101 in which the first via 102 made of tungsten, or the like is buried, and then the first copper wiring 104 is formed on the first via 102 and in the second interlayer insulating film 103 by the damascene method. In addition, a first silicon nitride film 115, a first FSG film 116, a first $SiO_2$ film 117, a second silicon nitride film 118, a second FSG film 119, and a second $SiO_2$ film 120 are formed in sequence on the second interlayer insulating film 103. Then, a reflection preventing film 121 made of silicon nitride is formed on the second $SiO_2$ film 120.

Then, an opening 122 having a via shape is formed over the first copper wiring 104 by patterning the reflection preventing film 121, the second $SiO_2$ film 120, the second FSG film 119 by means of the photolithography method.

In turn, resist 123 is coated on the reflection preventing film 121, and then a window 123a is formed in a second copper wiring forming portion by exposing/developing this resist 123. Then, a second wiring recess 125 is formed by etching vertically respective films from the reflection preventing film 121 to the second FSG film 119 via the window 123a in the resist 123. At the same time, respective films from the second silicon nitride film 118 to the first FSG film 116 below the opening 122 are also etched upon above etching, and thus a via hole 124 having the same diameter as the opening 122 is formed.

Then, as shown in FIG. 2B, a fence-like reaction product 126, i.e., a silicon compound, still remains in the neighborhood of the second wiring recess 125 when the resist 123 is removed.

As described above, if the hydrofluoric acid or the fluorine compound gas is employed to remove the reaction product 126, unevenness is caused on the side walls of the wiring recess 125 and the via hole 124, as shown in FIG. 2C. This is because respective etching rates of FSG, $SiO_2$, and silicon nitride against the hydrofluoric acid or the fluorine compound gas are different. The etching rates against the hydrofluoric acid or the fluorine compound gas are high in the order of FSG, $SiO_2$, and silicon nitride.

In this manner, if the metal such as tantalum nitride, copper, etc. is buried in the wiring recess 125 and the via hole 124 on the side wall of which the unevenness is caused, metal burying failure such as void, etc. is caused easily.

As described above, the fence of the reaction product which is generated in forming the recess in the insulating film causes peeling-off of the metal film which is buried in the wiring recess, and also the hydrofluoric acid or the fluorine compound gas employed to remove such reaction product generates the unevenness on the side wall of the recess to thus cause the metal burying failure.

Moreover, in order to prevent oxidation of the copper which is buried in the wiring recess and the via hole and diffusion of the copper into the insulating film, sometimes a silicon nitride film or a silicon nitride oxide film is formed under the wiring recess and the via hole. In this case, if the fluorine compound gas such as $CF_4$ is employed to remove the reaction product, the silicon nitride film or the silicon nitride oxide film is etched to some extent. As a result, there is such a possibility that the copper wiring or the copper via below the wiring recess and the via hole is oxidized.

SUMMARY OF THE INVENTION

It is an object of the present invention to provide a semiconductor device manufacturing method including the step of preventing reduction in film thickness of a silicon nitride film or a silicon nitride oxide film in removing fence-like reaction residues not to cause unevenness on side walls of holes when the reaction residues generated in forming recesses is removed.

According to the present invention, the wiring recess is formed by etching the insulating film while using the resist as a mask, then the resist is removed, and then the reaction product generated by etching the insulating film is removed by the plasma of the inactive gas. As the inactive gas being introduced, either a mixed gas of the inactive gas and the gas except halogen or the single inactive gas may be employed.

Therefore, the inner surface of the wiring recess and the inner surface of the via hole formed under the wiring recess can be prevented from being etched by the halogen gas in removing the reaction product, and thus generation of the unevenness on these inner surfaces can be suppressed. In addition, since the etching stopper film formed under the insulating film can be prevented from being etched by halogen, there is no possibility that the via or the wiring existing under the etching stopper film is exposed and oxidized.

BRIEF DESCRIPTION OF THE DRAWINGS

FIG. 4 is a schematic view showing an example of a configuration of an etching/plasma processing equipment used in embodiments of the present invention;

DESCRIPTION OF THE PREFERRED EMBODIMENTS

Embodiments of the present invention will be explained in detail with reference to the accompanying drawings hereinafter.

First Embodiment

FIGS. 3A to 3H are sectional views showing steps of manufacturing a semiconductor device according to a first embodiment of the present invention.

Figure 1A:
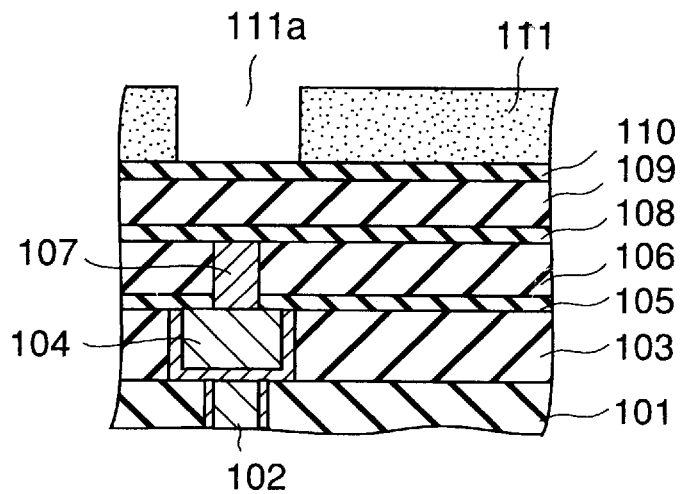
FIGS. 1A to 1C are sectional views showing steps of forming a copper wiring in the first prior art.
Figure 1B:
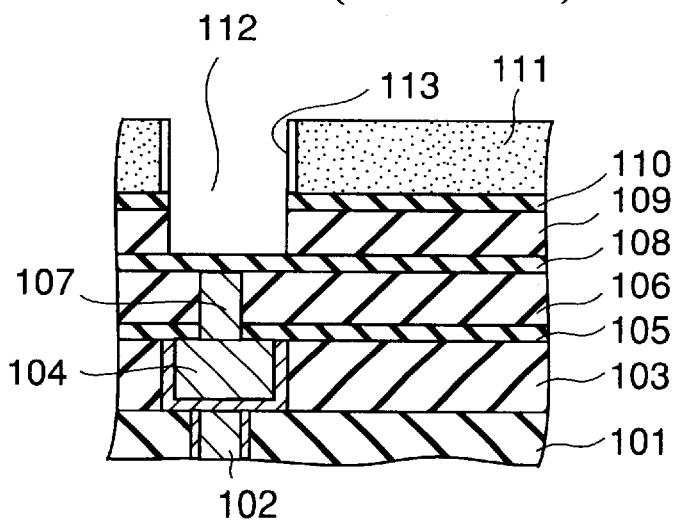
Figure 1C:
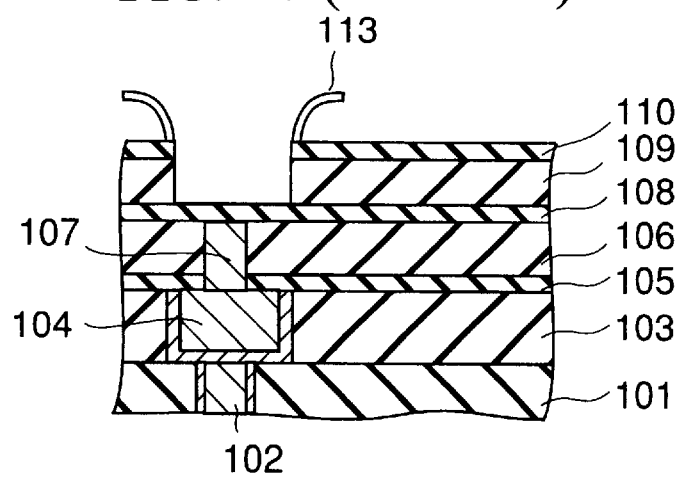
Figure 2A:
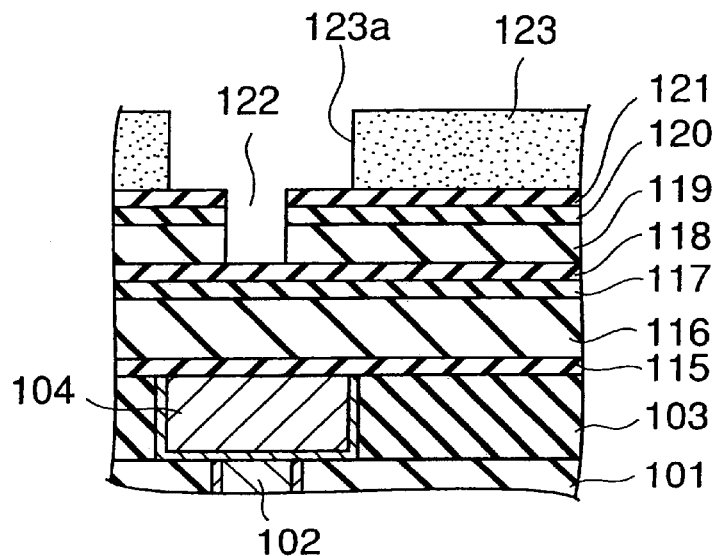
FIGS. 2A to 2C are sectional views showing steps of forming a copper wiring in the second prior art.
Figure 2B:
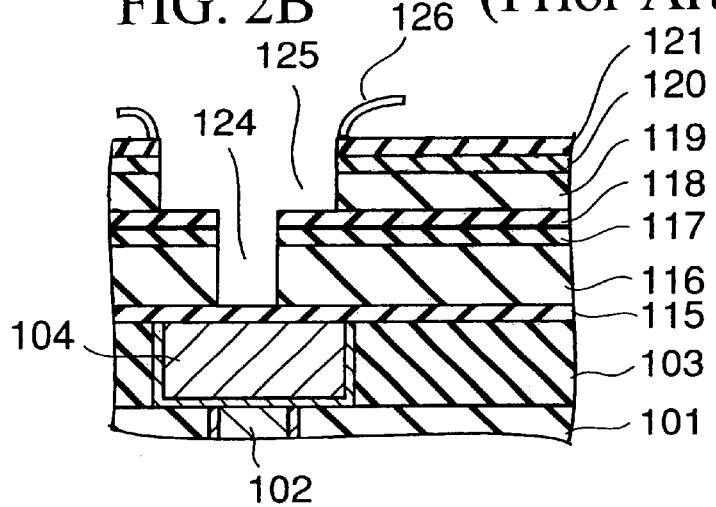
Figure 2C:
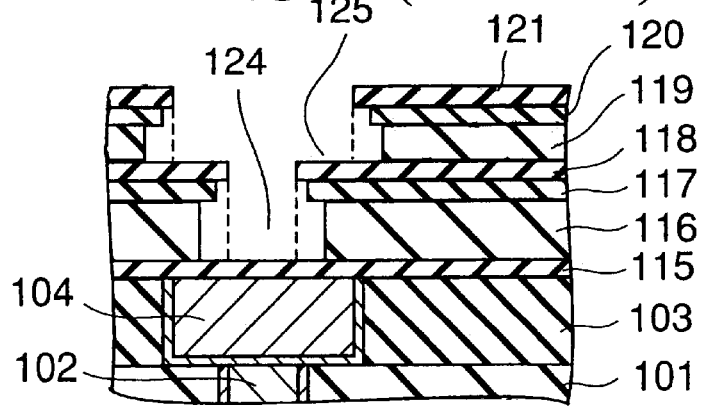
Figure 3A:
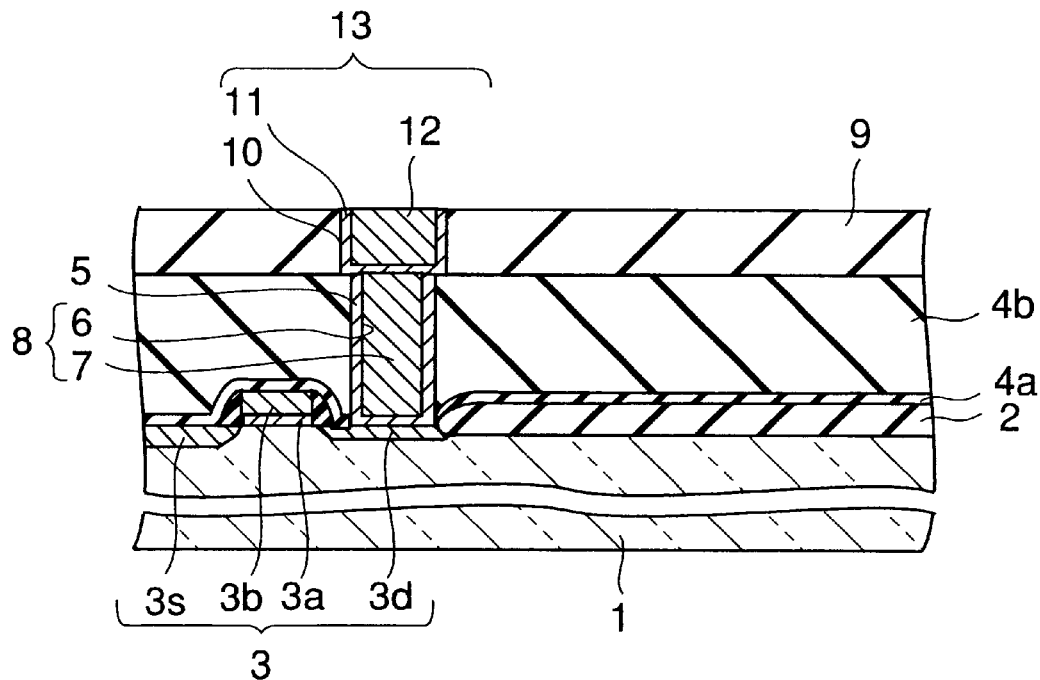
FIGS. 3A to 3H are sectional views showing steps of manufacturing a semiconductor device according to a first embodiment of the present invention.

To begin with, steps needed until the configuration shown in FIG. 3A is obtained will be explained hereunder.

In FIG. 3A, a MOS transistor 3 is formed on a silicon substrate (semiconductor substrate) 1 in a region which is surrounded by a field oxide film 2. The MOS transistor 3 includes a gate electrode 3b formed on the silicon substrate 1 via a gate oxide film 3a, and first and second impurity diffusion layers 3d, 3s formed in the silicon substrate 1 on both sides of the gate electrode 3b. The MOS transistor 3 is covered with an insulating protection film 4a made of $SiO_2$ and a first interlayer insulating film 4b made of $SiO_2$ containing insulating material such as PSG (Phospho-Silicate Glass) or $SiO_2$.

A contact hole 5 is formed in the first interlayer insulating film 4b and the insulating protection film 4a on the first impurity diffusion layers 3d. A tungsten (W) film 7 is buried in the contact hole 5 via a titanium nitride (TiN) film 6. The titanium nitride film 6 and the tungsten film 7 is employed as a first via (plug) 8.

Then, a second interlayer insulating film 9 made of $SiO_2$ is formed on the first interlayer insulating film 4b and the first via 8, and then a first copper wiring recess 10 is formed by patterning the second interlayer insulating film 9 by using the photolithography method to pass on the first via 8.

Then, a first tantalum nitride film 11 of about 20 nm thickness is formed along an inner surface of the first copper wiring recess 10 and an upper surface of the second interlayer insulating film 9 by the sputter method, and then a copper seed layer (not shown) of about 150 nm thickness is formed on the first tantalum nitride film 11 by the sputter method. In turn, a first copper (Cu) film 12 of about 750 nm thickness is formed on the first tantalum nitride film 11 and the seed layer by the electrolytic plating method. The first tantalum nitride film 11 is formed to prevent the diffusion of constituent elements of the first copper film 12 into the first interlayer insulating film 4b and the second interlayer insulating film 9.

Then, the first copper film 12 and the first tantalum nitride film 11 which exist on an upper surface of the second interlayer insulating film 9 are removed by the chemical mechanical polishing (CMP) method. Then, the first copper film 12 and the first tantalum nitride film 11 which remain in the first copper wiring recess 10 are used as a first copper wiring 13.

Figure 3B:
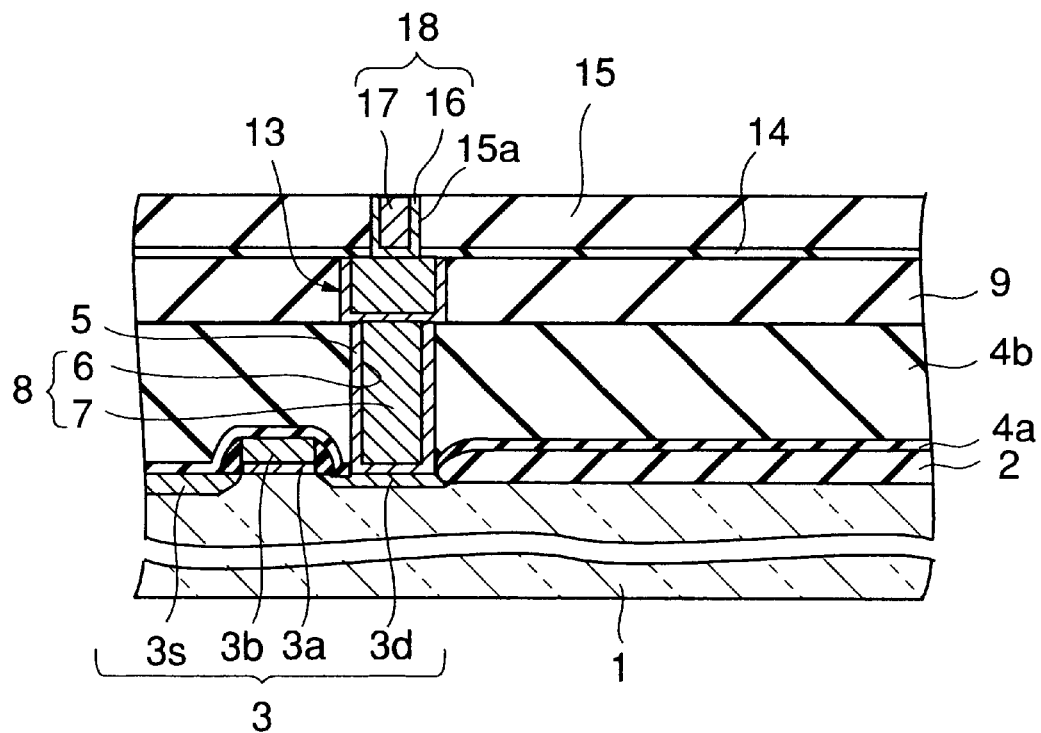
Figure 3C:
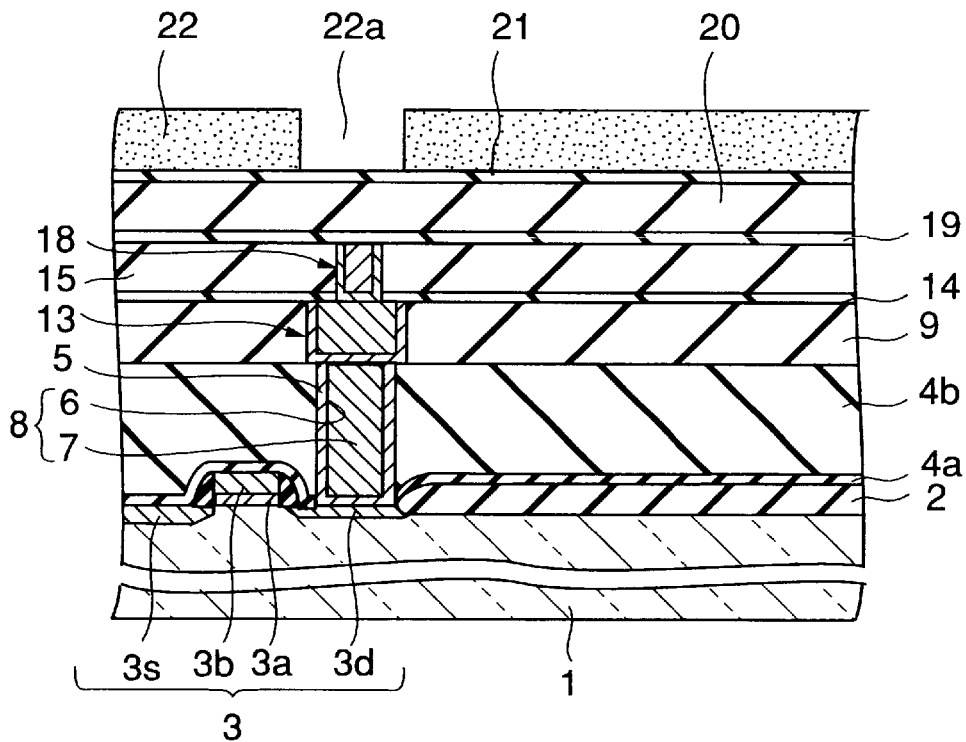

Then, as shown in FIG. 3B, a first silicon nitride film 14 of about 50 nm thickness is formed on the second interlayer insulating film 9 and the first copper wiring 13 by the CVD method. This first silicon nitride film 14 is used as a copper diffusion preventing barrier film. Then, a third interlayer insulating film 15 made of $SiO_2$ is formed on the first silicon nitride film 14 by the CVD method to have a thickness of about 500 nm.

Then, a via hole 15a is formed by pattering the third interlayer insulating film 15 and the first silicon nitride film 14 under different conditions by the photolithography method respectively to expose a part of the first copper wiring 13.

In this case, a mixed gas of $C_4F_8$, Ar, O2, and CO is employed as an etching gas in etching the third interlayer insulating film 15, and a mixed gas of $CHF_3$, Ar, and $O_2$ is employed as an etching gas in patterning the first silicon nitride film 14.

Then, a second tantalum nitride film 16 of 10 nm thickness and a second copper film 17 of 100 nm thickness are formed along an inner surface of the via hole 15a and an upper surface of the third interlayer insulating film 15 by the sputter method. Then, the second copper film 17 and the second tantalum nitride film 16 are polished successively by the CMP method to remain only in the via hole 15a. These films which remain in the via hole 15a are used as a second via 18.

Figure 3D:
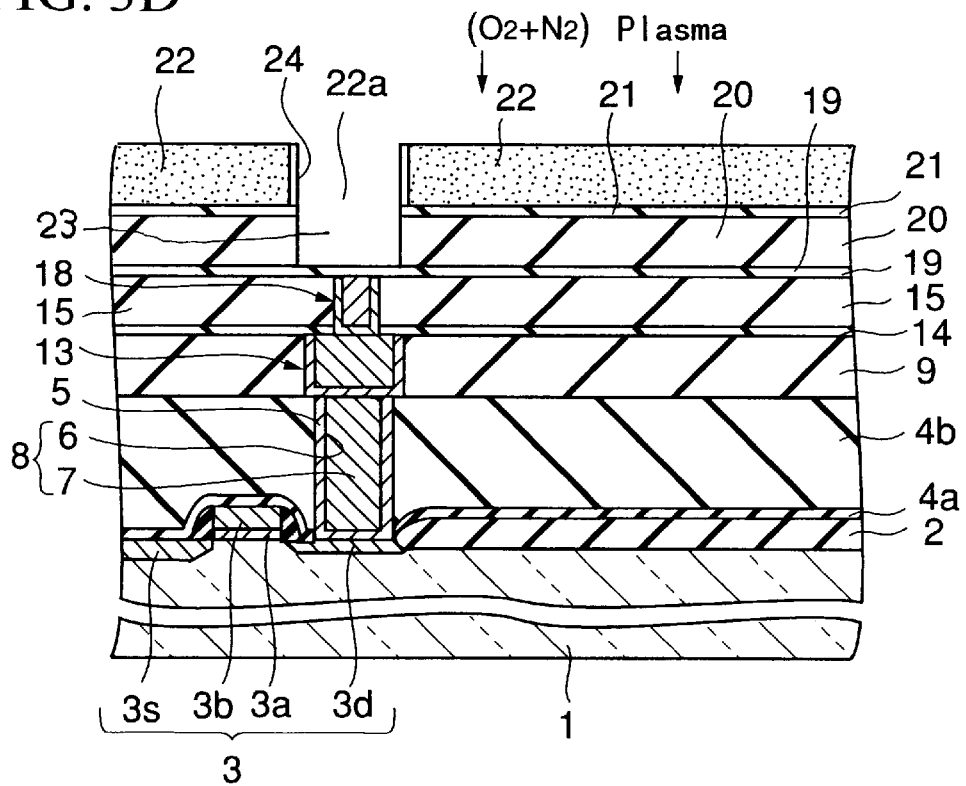

Next, as shown in FIG. 3D, a second silicon nitride film 19 of about 50 nm thickness is formed on the second via 18 and the third interlayer insulating film 15 by the plasma CVD method. Then, a fourth interlayer insulating film 20 made of $SiO_2$ is formed by the plasma CVD method to have a thickness of 500 nm to 1 μm. Then, a reflection preventing film 21 made of silicon nitride is formed on the fourth interlayer insulating film 20 by the plasma CVD method to have a thickness of about 50 nm.

Then, resist 22 is coated on the reflection preventing film 21 and then a wiring pattern window 22a is formed by exposing/developing the resist 22. The wiring pattern window 22a is formed at a position to pass over the second via 18.

Figure 3E:
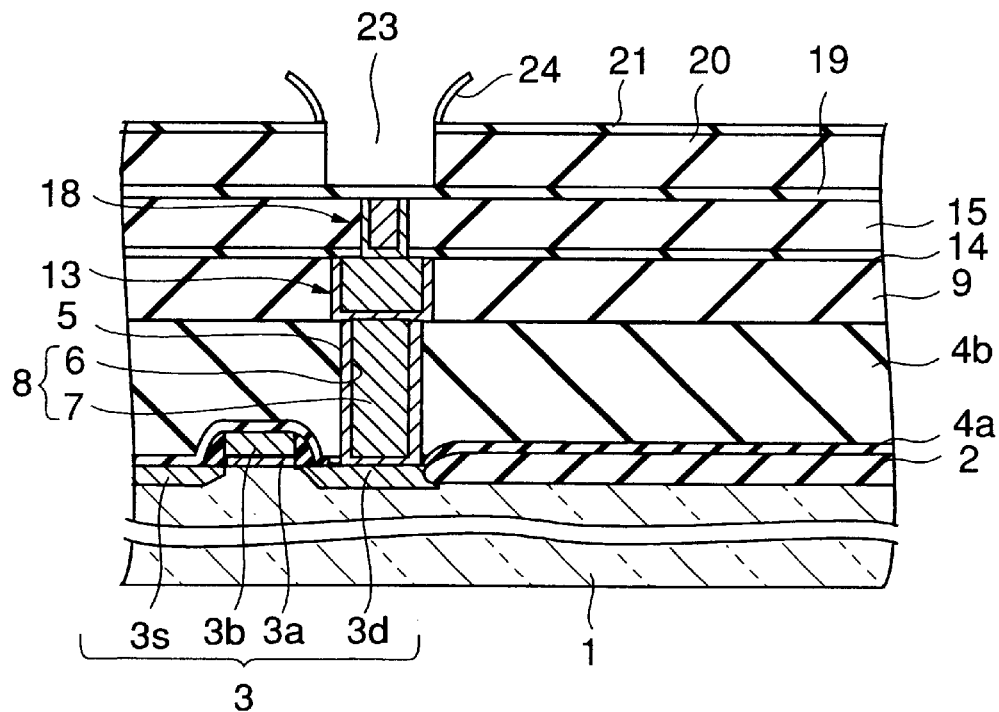

Then, with the use of the parallel plate type RIE equipment 200 as shown in FIG. 4, the reflection preventing film 21 and the fourth interlayer insulating film 20 are etched successively via the wiring pattern window 22a to form a second wiring recess 23, as shown in FIG. 3E. In this case, a mixed gas of $CHF_3$, Ar, and $O_2$, for example, is used as an etching gas of the reflection preventing film 21 made of silicon nitride, and a mixed gas of $C_4F_8$, Ar, $O_2$, and CO, for example, is used as an etching gas of the fourth interlayer insulating film 20 made of $SiO_2$.

The parallel plate type RIE equipment 200 shown in FIG. 4 includes a lower electrode 203 on which the substrate (wafer) 1 is loaded and an upper electrode 202 placed to face to the lower electrode 203 in a chamber 201. The upper electrode 202 has a shower function and has a configuration to emit the gas being introduced from a gas introducing pipe 204 to the substrate 1. An exhaust port 205 is provided to the chamber 201, and then a pressure of an inside of the chamber 201 is reduced into a desired pressure by an exhausting pump (not shown) connected to the exhaust port 205. In addition, a high voltage power supply Rf of 13.56 MHz, for example, is connected to the lower electrode 203.

The above gas for etching the reflection preventing film 21 and the fourth interlayer insulating film 20, or other gases are emitted to the substrate through the gas introducing pipe 204, and then plasmanized between the lower electrode 203 and the upper electrode 202.

During the step of forming the second wiring recess 23 by etching the reflection preventing film 21 and the fourth interlayer insulating film 20, silicon compound as the reaction product 24 is generated and adhered onto a side wall of the window 22a of the resist 22.

Then, the silicon substrate 1 is transferred into the ashing equipment (not shown). Then, a mixed gas of $O_2$ (oxygen) and $N_2$ (nitrogen) is plasmanized in the ashing equipment and then ashing of the resist 21 is performed by the plasma gas. As an example of the ashing conditions, a gas flow rate of $O_2$ is set to 2000 sccm, a gas flow rate of $N_2$ is set to 200 sccm, and a gas pressure in the ashing atmosphere is set to 1.5 Torr.

Since $CF_4$ as a fluorine compound gas is not contained in the ashing gas, the second silicon nitride film 19 exposed from the second wiring recess 23 is not etched, and thus the copper via 18 located under the second silicon nitride film 19 is never exposed and thus not oxidized.

However, since the fluorine is not contained in the ashing gas of the resist 22, the reaction product 24, i.e., the silicon compound stuck onto the inner surface of the window 22a in the resist 22 during the ashing is not etched to remain.

As a result, after the ashing of the resist 22, the reaction product 24 remains like a fence in the neighborhood of the second wiring recess 23, as shown in FIG. 3E and FIGS. 5A to 5D.

Figure 3F:
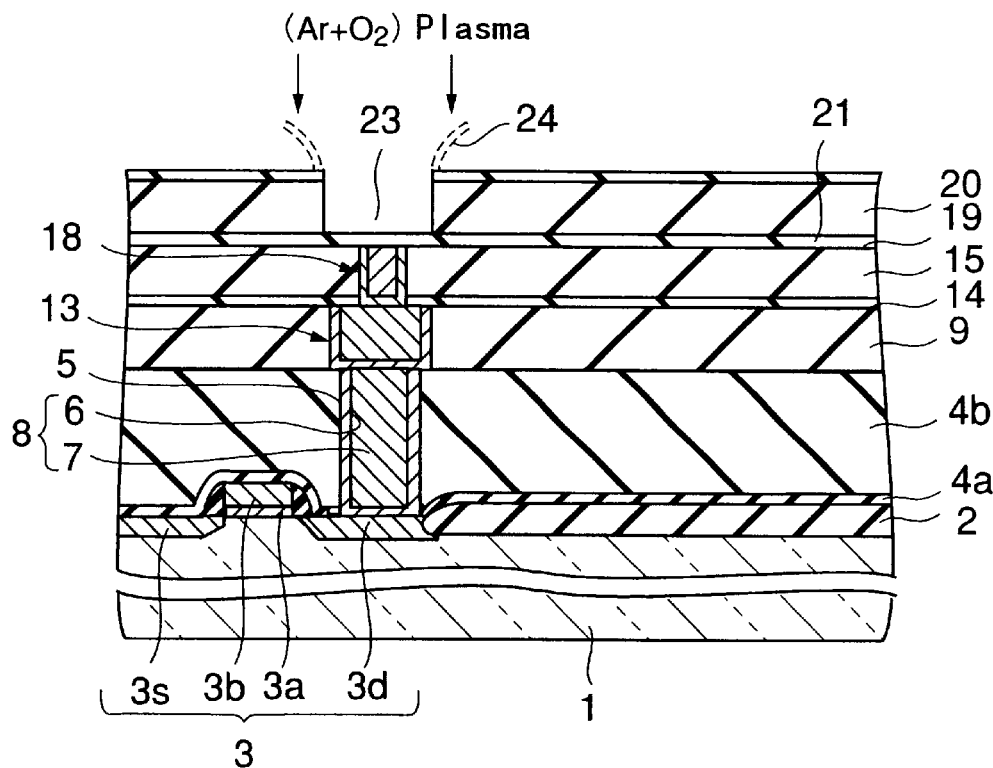

Therefore, the silicon substrate 1 is transferred into the RIE equipment 200. As shown in FIG. 3F, a mixed gas of Ar (argon) and $O_2$ is plasmanized in the chamber 201, and accordingly the fence-like reaction product 24 is removed. As an example of the etching conditions, a gas flow rate of Ar is set to 100 sccm, a gas flow rate of $O_2$ is set to 10 sccm, a high frequency power for generating the plasma is set to 400 W, and a pressure in the plasma atmosphere is set to 50 mTorr.

Since the fluorine compound gas is not used in removing the reaction product 24, the second silicon nitride film 19 formed under the second wiring recess 23 is not etched. Thus, the copper via 18 is never exposed and not oxidized, and the side wall of the second wiring recess 23 is not etched not to generate the unevenness.

Figure 3G:
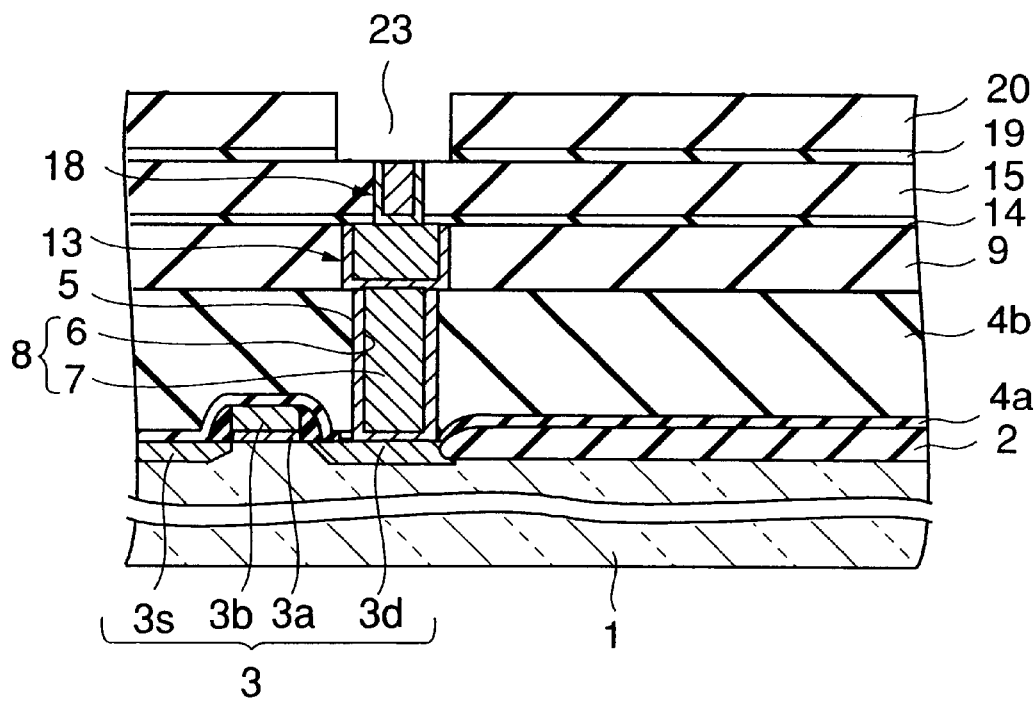
Figure 6A:
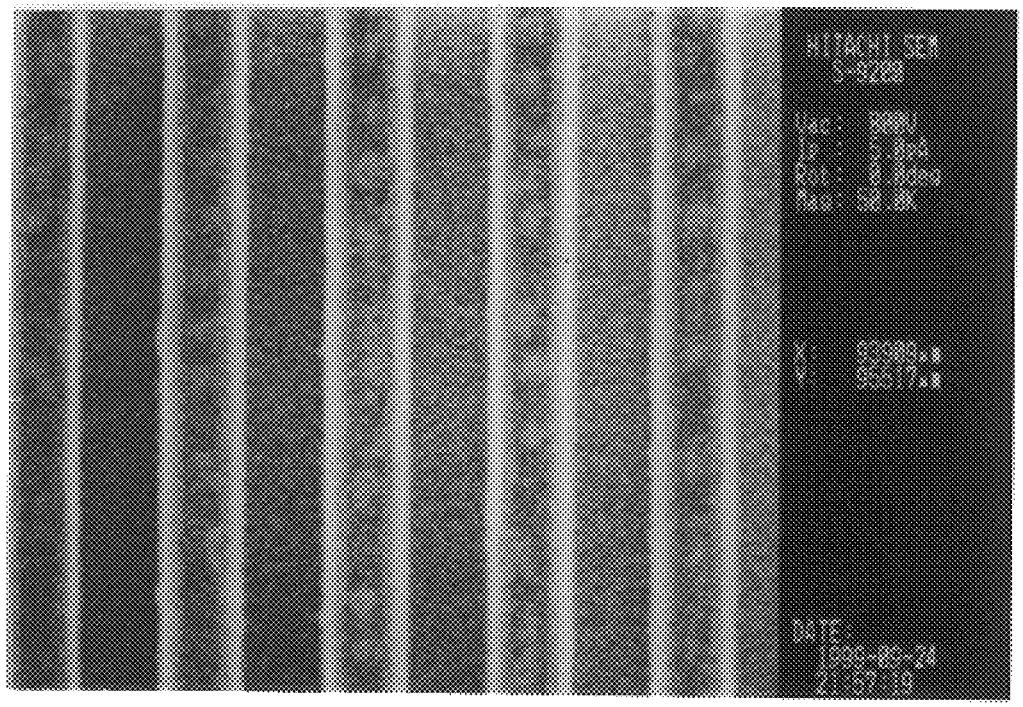
FIGS. 6A and 6B are microphotographs of a planar surface immediately after patterning of a silicon nitride film in the prior art.
Figure 6B:
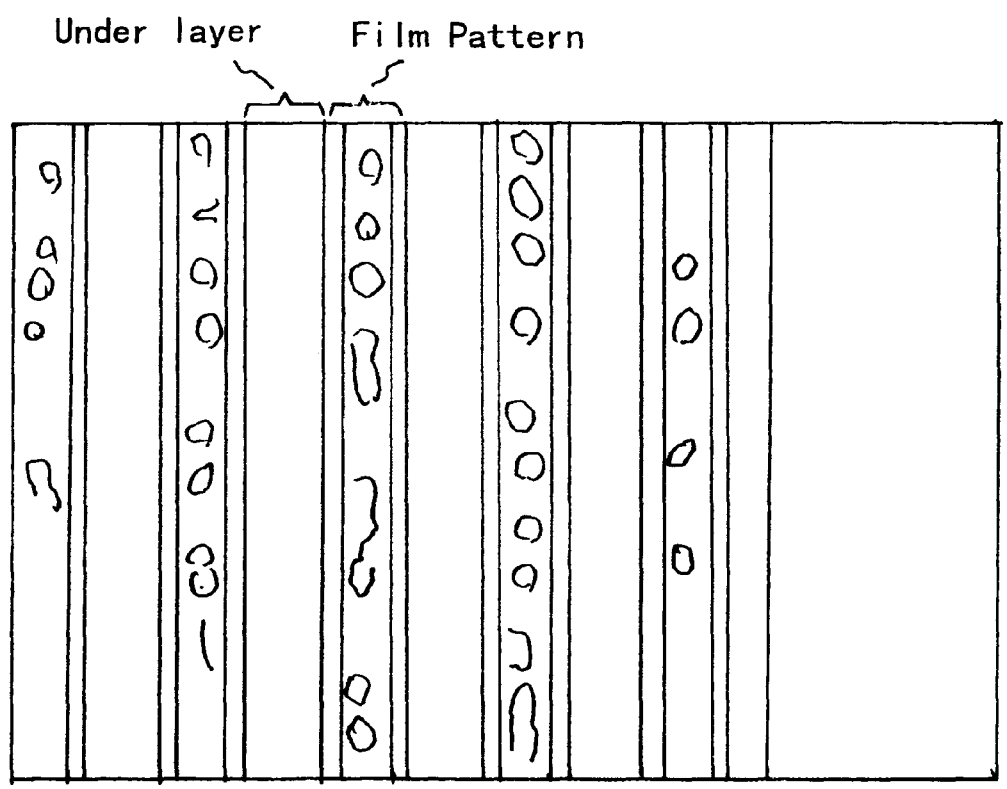

Then, a mixed gas of CHF$_3$, Ar, and O$_2$ is introduced into the chamber 201. Then, as shown in FIG. 3G, the second silicon nitride film 19 formed under the second wiring recess 23 is removed by etching. At this time, the reflection preventing film 21 made of silicon nitride is etched simultaneously to expose the fourth interlayer insulating film 20. In this case, since the reaction product 24 does not remain on the reflection preventing film 21, etching of the reflection preventing film 21 is never stopped partially by the reaction product 24. Therefore, such a phenomenon is not caused that, as shown in FIGS. 6A and 6B, a part of the reflection preventing film 21 remains and the unevenness is never generated on the fourth interlayer insulating film 20.

Since an etching time of the second silicon nitride film 19 is short, there is no situation that the unevenness is generated on the side wall of the second wiring recess 23. Also, an upper surface of the second via 18 is exposed by the etching of the second silicon nitride film 19, but the minute oxide formed on the upper surface of the second via 18 can be removed by the sputter effect of the RIE etching.

Then, the silicon substrate 1 is transferred from the RIE equipment 200 to the sputter equipment (not shown). Then, a third tantalum nitride film 25 of 5 nm thickness is formed along an inner surface of the second wiring recess 23 and an upper surface of the fourth interlayer insulating film 20 in the sputter equipment. Then, a copper seed film (not shown) is formed on the third tantalum nitride film 25. Then, the silicon substrate 1 is picked up from the sputter equipment, and then a third copper film 26 is formed on the third tantalum nitride film 25 by the electrolytic plating method. Since the reaction product 24 does not remain on the fourth interlayer insulating film 20 when these metal films 25, 26 are formed, these metal films 25, 26 are hard to peel off.

Figure 3H:
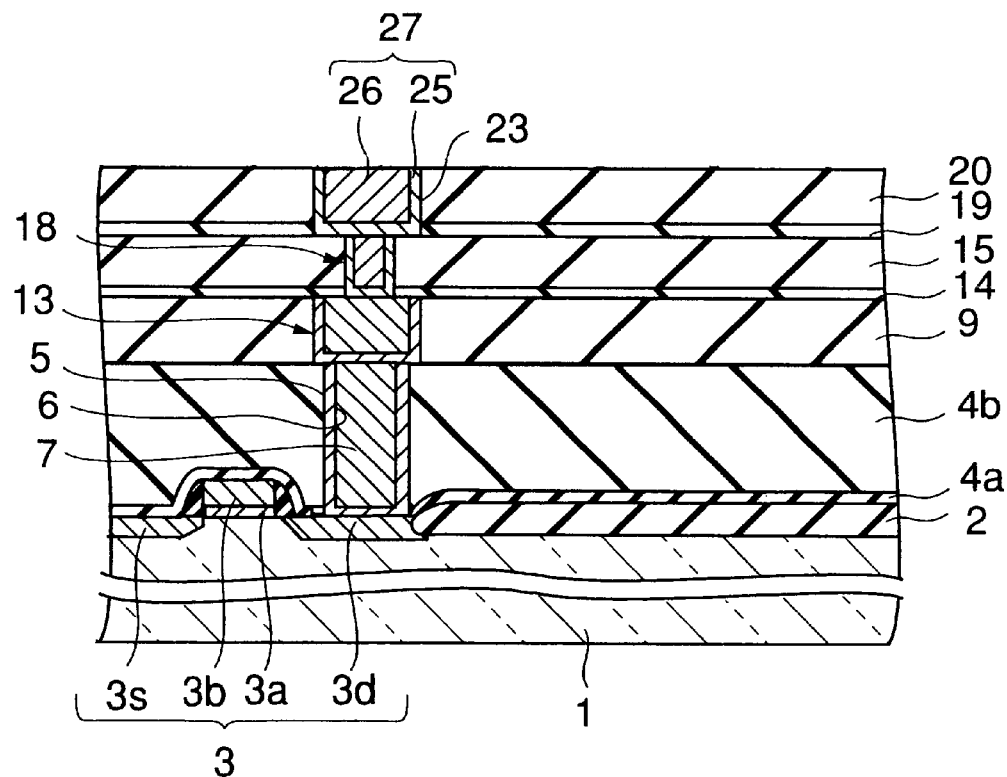
Figure 5A:
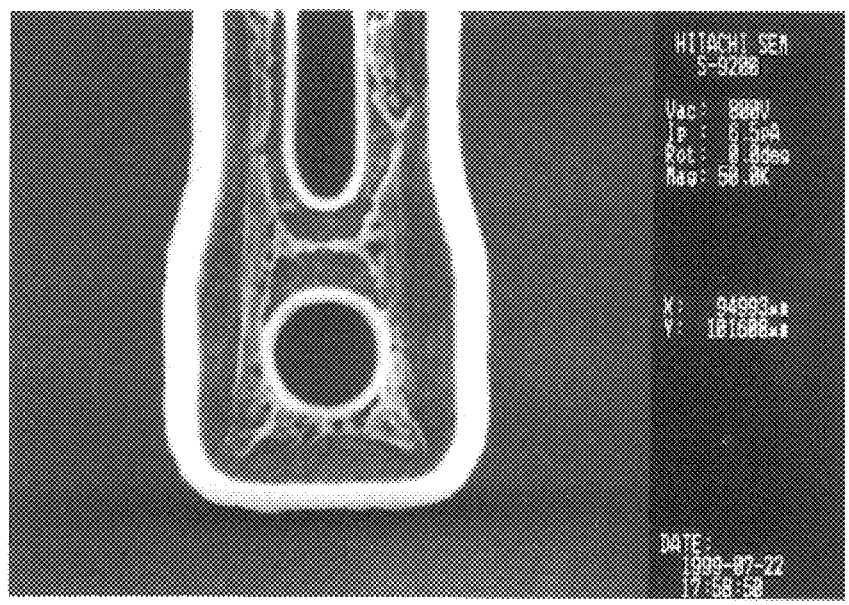
FIGS. 5A to 5D are microphotographs of a planar surface showing a recess, a film pattern, and a reaction product immediately after recess formation according to the embodiments of the present invention.
Figure 5B:
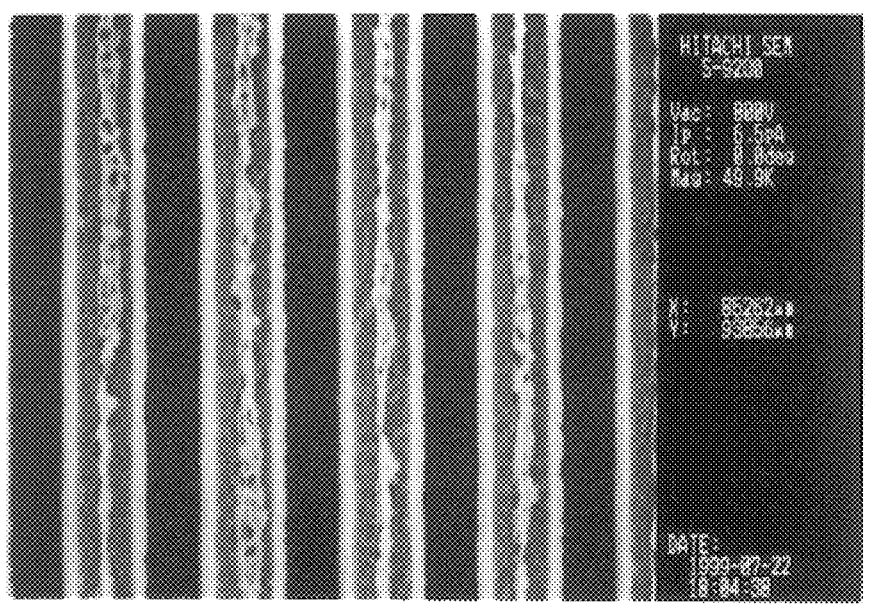
Figure 5C:
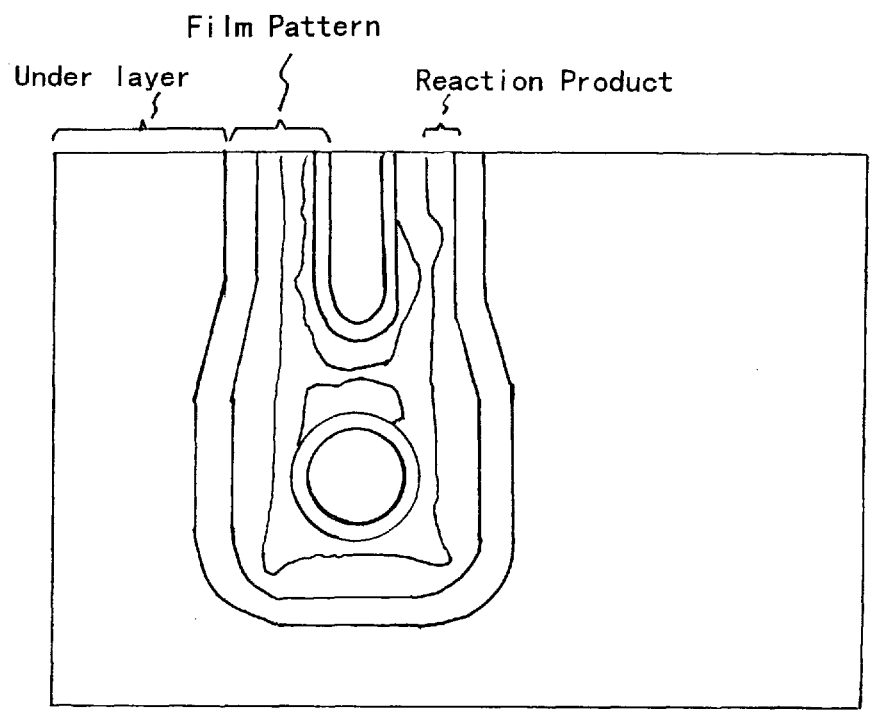
Figure 5D:
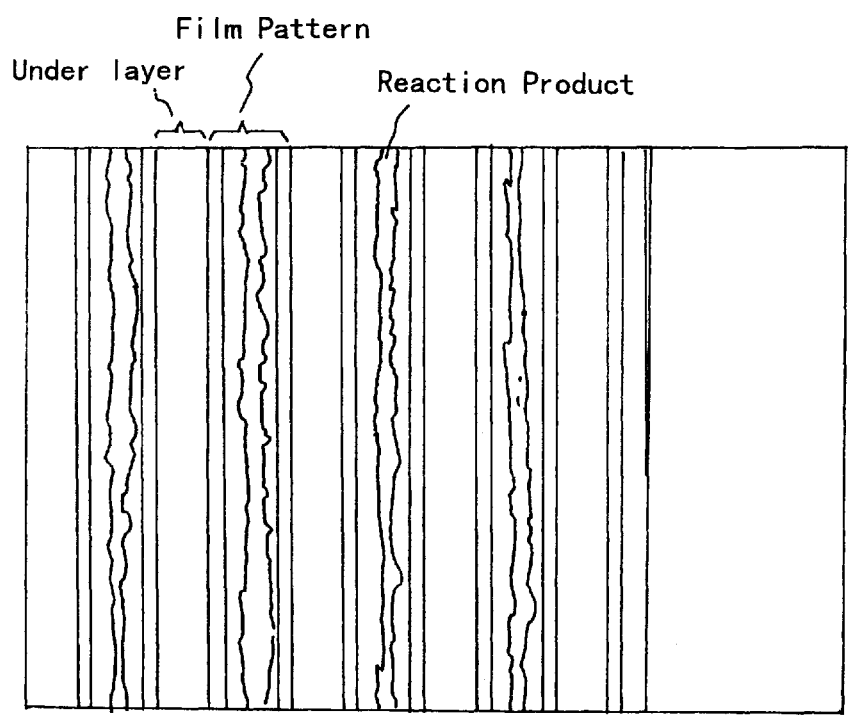

Then, as shown in FIG. 3H, the third copper film 26 and the third tantalum nitride film 25 are polished by virtue of the CMP method to remove them from the surface of the fourth interlayer insulating film 20. Accordingly, a second copper wiring 27 is constructed by the third copper film 26 and the third tantalum nitride film 25, both remain on the second wiring recess 23.

A multi-layered copper wiring can be formed by repeating the formation of the via 18 and the copper wirings 13, 27 based on the single damascene method, as described above.

Meanwhile, it may be considered that the reaction product 24 which is stuck onto the side wall of the window 22a of the resist 22 is removed by the argon sputter prior to the ashing of the resist 22, but an efficiency of removing the reaction product 24 by this method is extremely low. In other words, since the resist 22 is charged negatively after the fourth interlayer insulating film 20 is etched by the RIE method while using the resist 22 as a mask, argon plus ions easily proceed in the direction perpendicular to a principal surface of the silicon substrate 1, but hardly proceed in the oblique direction. As a result, it is difficult to remove the reaction product 24 on the side wall of the window 22a. In contrast, after the resist 22 has been removed, components of the argon plus ions which proceed obliquely relative to the principal surface of the silicon substrate 1 are increased, and thus removal of the fence-like reaction product 24 can be made easy.

The fence-like reaction product 24 is easily generated when an etching area of the interlayer insulating film occupies several tens %, e.g., 20 to 30%, of the overall area of the wafer. But an amount of the generated reaction product is small when several % of the overall area of the wafer is etched such as the formation of the via hole.

The explanation of removal of the fence-like reaction product has not been made in forming the above first copper wiring 13. However, if the unevenness is generated on the side wall of the first wiring recess 10 or if etching of the first interlayer insulating film 4b thereunder should be prevented, the ashing of the resist employed in forming the first wiring recess 10 may be removed by the plasma of the mixed gas of oxygen and nitrogen and then the reaction product may be removed by the plasma of the mixed gas of argon and oxygen.

Second Embodiment

In the above first embodiment, ashing of the resist and removal of the reaction product are performed separately by using different reaction gases. But ashing of the resist and removal of a part of the reaction product may be performed simultaneously and such steps will be explained hereinbelow.

FIGS. 7A to 7F are sectional views showing steps of forming a multi-layered wiring of a semiconductor device according to a second embodiment of the present invention. Like references used in the first embodiment denotes like elements. Although the explanation about constituent elements positioned under the first interlayer insulating film 4b will be omitted hereunder in the second embodiment, it is similar to the first embodiment that the insulating protection film 4a, the MOS transistor 3, and the silicon substrate 1 are covered with the first interlayer insulating film 4b.

First, like the first embodiment, the first via 8 is formed in the first interlayer insulating film 4b, the first copper wiring 13 is formed in the second interlayer insulating film 9, and the second via 18 connected to the first copper wiring 13 is formed in the first silicon nitride film 14 and the third interlayer insulating film 15. Then, the second silicon nitride film 19, the fourth interlayer insulating film 20, and the reflection preventing film 21 are formed on the second via 18 and the third interlayer insulating film 15.

Figure 7A:
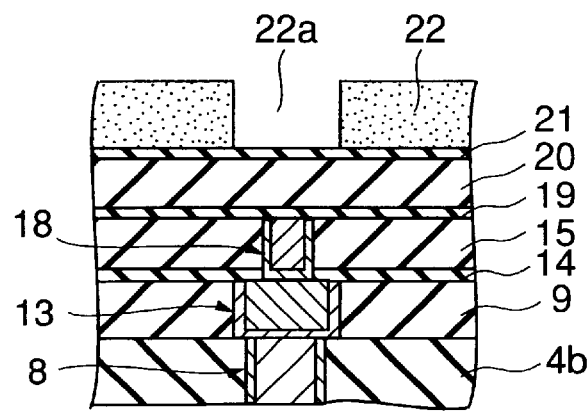
FIGS. 7A to 7F are sectional views showing steps of forming a multi-layered wiring of a semiconductor device according to a second embodiment of the present invention.

Thereafter, as shown in FIG. 7A, the resist 22 is coated on the reflection preventing film 21 and then the wiring pattern window 22a is formed by exposing/developing the resist 22. The wiring pattern window 22a is formed at a position to pass over the second via 18.

Figure 7B:
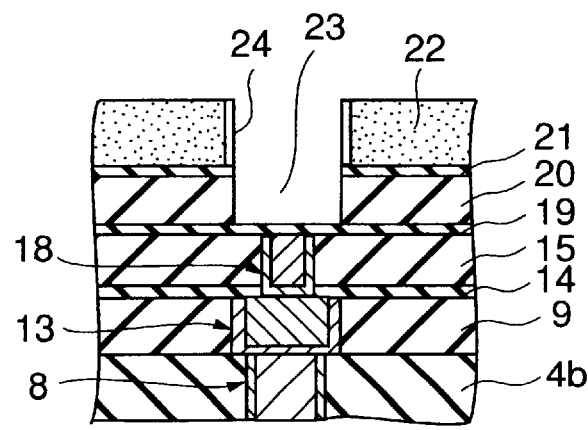

Then, with the use of the parallel plate type RIE equipment 200, as shown in FIG. 7B, the second wiring 20 recess 23 is formed by etching successively the reflection preventing film 21 and the fourth interlayer insulating film 20 via the wiring pattern window 22a. In this case, a mixed gas of CHF$_3$, Ar, and O$_2$, for example, is used as an etching gas of the reflection preventing film 21 made of silicon nitride, and a mixed gas of Ar, O$_2$, and CO, for example, is used as an etching gas of the fourth interlayer insulating film 20 made of SiO$_2$. At the time of etching these films, like the first embodiment, the reaction product 24 is generated and stuck onto the side wall of the window 22a in the resist 22.

After these etchings, a mixed gas of O$_2$ and CF$_4$ is plasmanized in the ashing equipment to perform the ashing of the resist 22. Although CF$_4$ as the fluorine compound gas is contained in the ashing gas, etching of the second silicon nitride film 19 under the second wiring recess 23 can be suppressed if a concentration of CF$_4$ is set to a flow rate smaller than an ordinary amount, i.e., less than a flow % of 5. Thus, the second via 23 made of copper is not exposed and thus oxidation of the second via 23 does not occur.

Figure 7C:
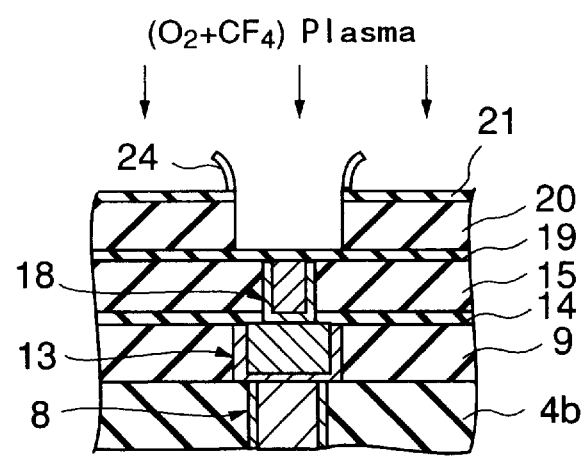

If the ashing of the resist 22 is performed under such conditions, the fence-like reaction product 24 is etched slightly but not perfectly removed, as shown in FIG. 7C, and thus a part of the reaction product 24 still remains.

Figure 7D:
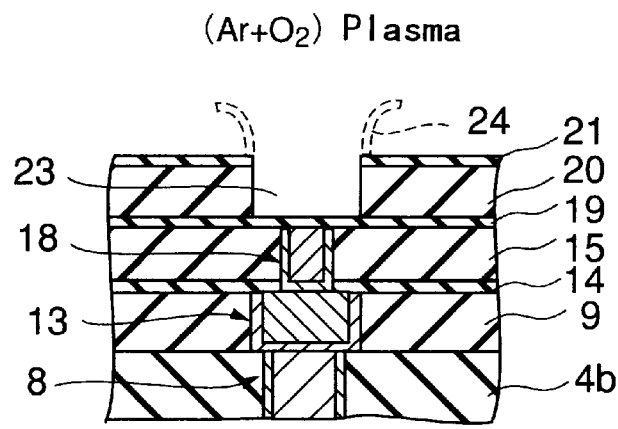
Figure 7E:
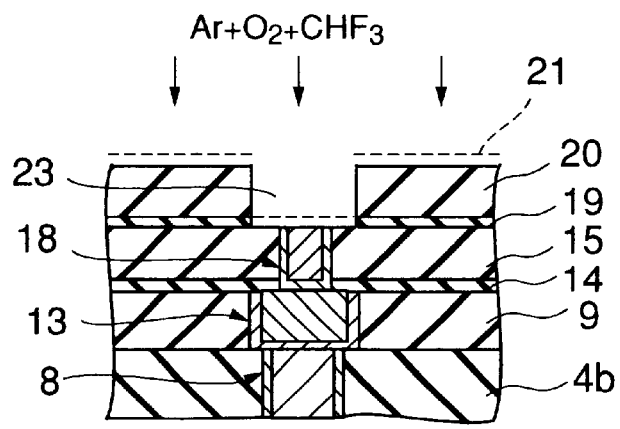

Then, as shown in FIG. 7D, residue of the reaction product 24 is removed by the plasma of Ar and $O_2$ by using the plasma generating equipment. Then, as shown in FIG. 7E, the second silicon nitride film 19 exposed from the second wiring recess 23 is etched by using a mixed gas of Ar, $O_2$, $CHF_3$ to expose the second via 18. At this time, the reflection preventing film 21 made of silicon nitride is etched simultaneously to expose the fourth interlayer insulating film 20.

Figure 7F:
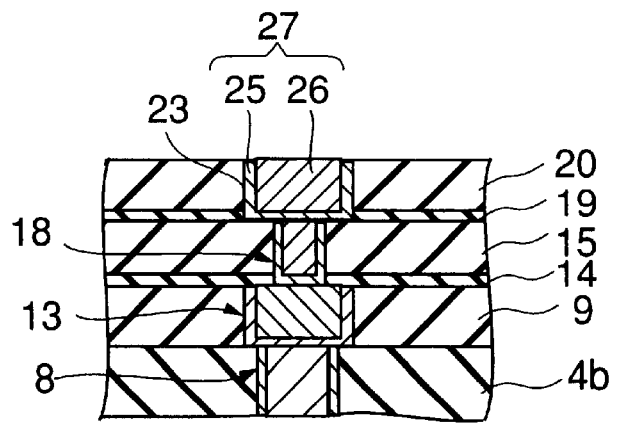

Then, as shown in FIG. 7F, according to the same method as the first embodiment, the second wiring 27 formed as a double layer structure consisting of the tantalum nitride film 25 and the copper film 26 is formed in the second wiring recess 23.

In the second embodiment described above, the unevenness is in no way generated on the side wall of the wiring recess 23 and the upper surface of the fourth interlayer insulating film 20, like the first embodiment.

Third Embodiment

In the first and second embodiments, the steps of forming the via and the copper wiring by the single damascene method have been explained. In contrast, in a third embodiment, steps of forming the via and the copper wiring by the dual damascene method will be explained hereinbelow.

FIGS. 8A to 8G are sectional views showing steps of forming a multi-layered wiring of a semiconductor device according to a third embodiment of the present invention. Although the explanation about constituent elements positioned under the first interlayer insulating film 4b will be omitted hereunder in the third embodiment, it is similar to the first embodiment that the insulating protection film 4a, the MOS transistor 3, and the silicon substrate 1 are covered with the first interlayer insulating film 4b.

At first, like the first embodiment, the first via 8 is formed in the first interlayer insulating film 4b, and the first copper wiring 13 is formed in the second interlayer insulating film 9.

Then, the first silicon nitride film 14, the third interlayer insulating film 15, the second silicon nitride film 19, the fourth interlayer insulating film 20, and the reflection preventing film 21 are formed in sequence on the first copper wiring 13 and the second interlayer insulating film 9 by the plasma CVD method. Respective films from the first silicon nitride film 14 to the reflection preventing film 21 may be formed successively by the same CVD equipment. Also, formation of the via is not performed during the film formation from the first silicon nitride film 14 to the reflection preventing film 21.

Figure 8A:
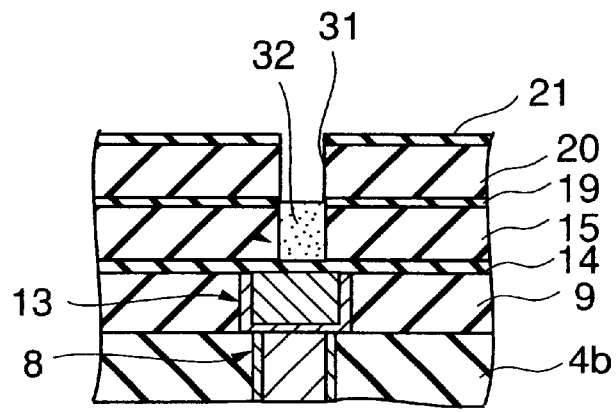
FIGS. 8A to 8G are sectional views showing steps of forming a multi-layered wiring of a semiconductor device according to a third embodiment of the present invention.

Subsequently, as shown in FIG. 8A, a part of the films from the reflection preventing film 21 to the third interlayer insulating film 15 is etched by the photolithography method to form a via hole 31 located over the first copper wiring 13. The etching conditions of these films are set similar to those in the first embodiment.

In addition, a protection material 32 such as organic material is coated in the via hole 31 and on the reflection preventing film 21, and then the protection material 32 is left only under the via hole 31 by etching back such protection material 32.

Figure 8B:
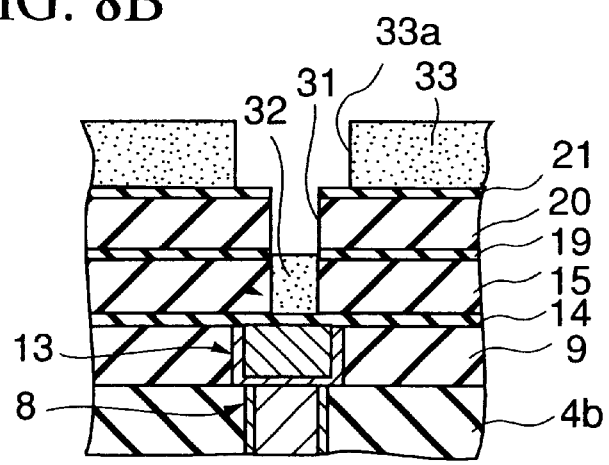

Then, as shown in FIG. 8B, photoresist 33 is coated on the reflection preventing film 21, and then a wiring pattern window 33a having a wiring shape is formed by exposing/developing the photoresist 33.

Figure 8C:
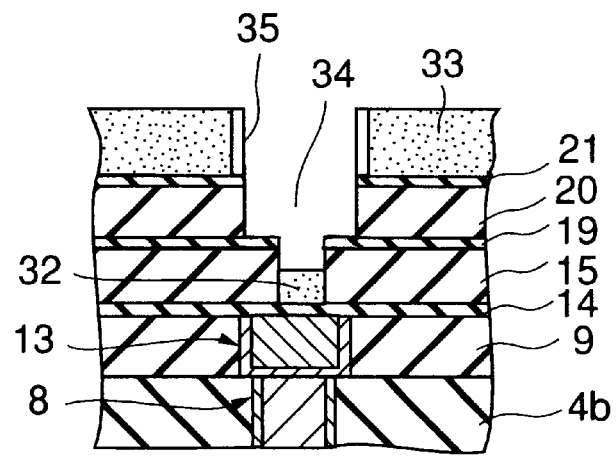

Thereafter, by using the parallel plate type RIE equipment 200, the reflection preventing film 21 and the fourth interlayer insulating film 20 are etched successively via the wiring pattern window 33a to thus form a second wiring recess 34, as shown in FIG. 8C. In this case, a mixed gas of $CHF_3$, Ar, and $O_2$, for example, is used as an etching gas of the reflection preventing film 21 made of silicon nitride, and a mixed gas of $C_4F_8$, Ar, $O_2$, and CO, for example, is used as an etching gas of the fourth interlayer insulating film 20 made of $SiO_2$.

During the formation of the second wiring recess 34 by the reflection preventing film 21 and the fourth interlayer insulating film 20, the silicon compound as the reaction product 35 is generated and stuck onto the side wall of the window 33a of the resist 33. In this case, the first silicon nitride film 14 is never etched because it is protected by the protection material 32.

Then, the mixed gas of $O_2$ and $N_2$ is plasmanized by the ashing equipment, and then the ashing of the resist 33 and the protection material 32 is carried out by the plasma gas. Since no fluorine compound gas is contained in this ashing gas, the second silicon nitride film 19 exposed from the second wiring recess 34 and the via hole 31 is not etched. Therefore, the first copper wiring 13 formed under the second silicon nitride film 19 is not exposed and thus not oxidized.

However, since no fluorine is contained in the ashing gas of the resist 33 and the protection material 32, reaction product (silicon compound) 35 which is stuck onto the inner surface of the window 33a in the resist 33 at the time of ashing is not etched and thus still remains.

Figure 8D:
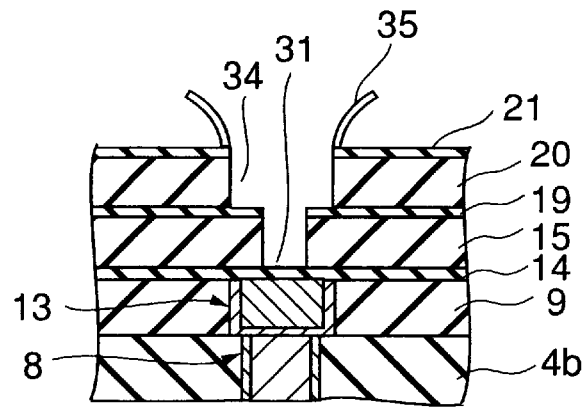
Figure 8E:
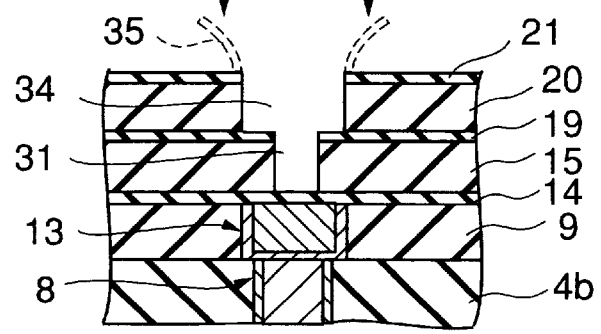

Accordingly, after the ashing of the resist 33 and the protection material 32, the reaction product 35 shown in FIG. 8D remains like the fence in the neighborhood of the second wiring recess 34. Therefore, prior to exposing the first copper wiring 13 by etching the first silicon nitride film 14, as shown in FIG. 8E, the mixed gas of Ar and $O_2$ is introduced into the chamber of the plasma generating equipment and then plasmanized to remove the fence-like reaction product 35.

Since the fluorine compound gas is not employed in removing the reaction product 35, the first silicon nitride film 14 formed under the second wiring recess 34 is not etched, so that the first copper wiring 13 is not exposed and thus not oxidized. As a result, no unevenness is generated on the side walls of the via hole 31 and the second wiring recess 34.

Figure 8F:
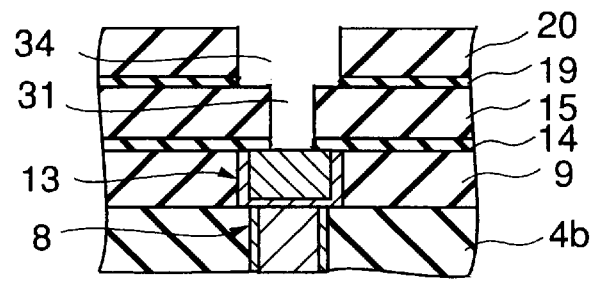

After this, as shown in FIG. 8F, the first silicon nitride film 14 and the second silicon nitride film 19 located under the second wiring recess 34 and the via hole 31 are removed by etching them by virtue of the RIE method using the mixed gas of $CHF_3$, Ar, and $O_2$. At this time, the reflection preventing film 21 made of silicon nitride is etched simultaneously to expose the fourth interlayer insulating film 20. In this case, because the reaction product 35 is not left on the reflection preventing film 21, the etching of the reflection preventing film 21 is never blocked by the reaction product 24.

Thereafter, like the first embodiment, a third tantalum nitride film 36 of 5 nm thickness is formed by the sputter method along inner surfaces of the second wiring recess 34 and the via hole 31 and the upper surface of the fourth interlayer insulating film 20. Then, a copper seed film (not shown) is formed on the third tantalum nitride film 36. In addition, a third copper film 37 is formed on the third tantalum nitride film 36 by the electrolytic plating method. Since no reaction product remains on the fourth interlayer insulating film 20 when these metal films 36, 37 are formed, such metal films 36, 37 are hard to peel off.

Figure 8G:
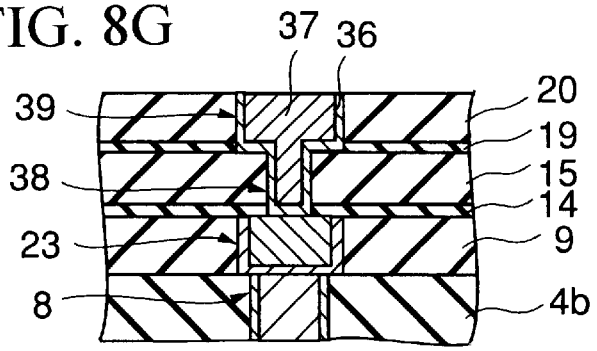

Then, as shown in FIG. 8G, the third copper film 37 and the third tantalum nitride film 36 are removed from the upper surface of the fourth interlayer insulating film 20 by polishing them by means of the CMP method. Thereby, a second via 38 is composed of the third copper film 37 and the third tantalum nitride film 36, both are left in the via hole 31, and also a second copper wiring 39 is composed of the third copper film 37 and the third tantalum nitride film 36, both are left in the second wiring recess 34.

In the third embodiment, the second silicon nitride film 19 is formed between the third interlayer insulating film 15 and the fourth interlayer insulating film 20, but such second silicon nitride film 19 may be omitted. If the second silicon nitride film 19 is omitted, a depth of the second wiring recess 34 can be adjusted by controlling the etching time when the second wiring recess 34 is formed by etching the third interlayer insulating film 15 and the fourth interlayer insulating film 20.

Fourth Embodiment

In a fourth embodiment, steps of forming the via and the copper wiring by the dual damascene method which is different from that in the third embodiment will be explained hereinbelow.

FIGS. 9A to 9G are sectional views showing steps of forming a multi-layered wiring of a semiconductor device according to the fourth embodiment of the present invention. Although the explanation about constituent elements positioned under the first interlayer insulating film 4b will be omitted hereunder in the fourth embodiment, it is similar to the first embodiment that the insulating protection film 4a, the MOS transistor 3, and the silicon substrate 1 are covered with the first interlayer insulating film 4b.

First, like the first embodiment, the first via 8 is formed in the first interlayer insulating film 4b and also the first copper wiring 13 is formed in the second interlayer insulating film 9.

Then, the first silicon nitride film 14, the third interlayer insulating film 15, the second silicon nitride film 19, the fourth interlayer insulating film 20, and the reflection preventing film 21 are formed in sequence on the first copper wiring 13 and the second interlayer insulating film 9 by the plasma CVD method. Respective films from the first silicon nitride film 14 to the reflection preventing film 21 may be formed successively by the same CVD equipment. Also, formation of the via is not performed during the film formation from the first silicon nitride film 14 to the reflection preventing film 21.

Figure 9A:
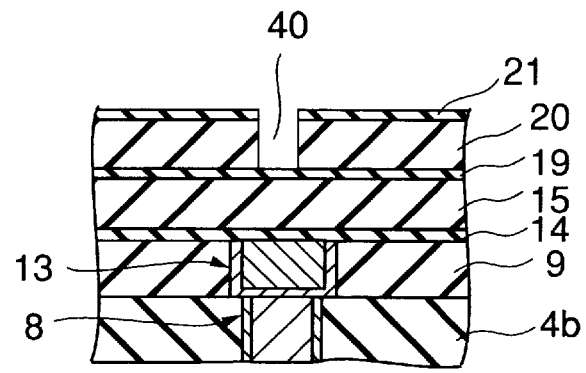
FIGS. 9A to 9G are sectional views showing steps of forming a multi-layered wiring of a semiconductor device according to a fourth embodiment of the present invention.

Then, as shown in FIG. 9A, a part of the reflection preventing film 21 and the fourth interlayer insulating film 20 is etched by the photolithography method to form a via-shaped opening 40 located over the first copper wiring 13. The etching conditions of these films are set similar to those in the first embodiment.

Figure 9B:
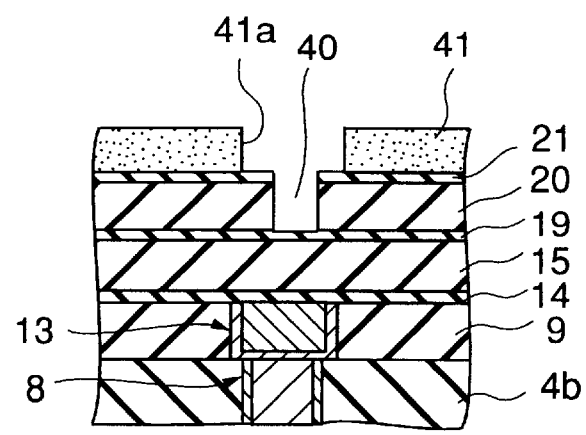

Then, as shown in FIG. 9B, photoresist 41 is coated on the reflection preventing film 21, and then a wiring pattern window 41a having a wiring shape is formed by exposing/developing the photoresist 41.

Figure 9C:
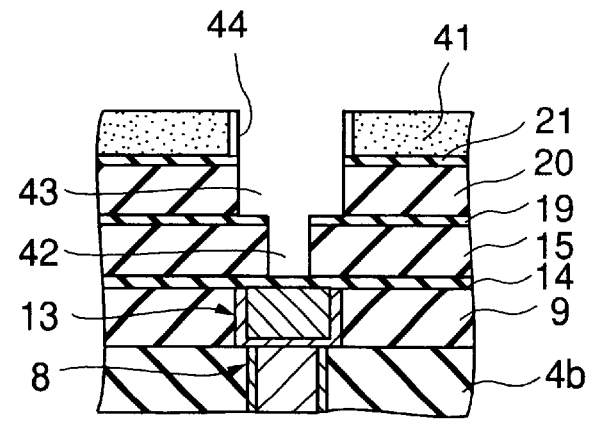

Thereafter, when a plurality of films from the reflection preventing film 21 to the third interlayer insulating film 15 are successively etched via the wiring pattern window 41a and the opening 40 by using the parallel plate type RIE equipment 200, a second wiring recess 43 is formed in the reflection preventing film 21 and the fourth interlayer insulating film 20, as shown in FIG. 9C. At the same time, an opening which has the same diameter as the opening 41 is formed in the second silicon nitride film 19 and the third interlayer insulating film 15. In this case, a mixed gas of $CHF_3$, Ar, and $O_2$, for example, is used as an etching gas of the reflection preventing film 21 and the second silicon nitride film 19, and a mixed gas of $C_4F_8$, Ar, $O_2$, and CO, for example, is used as an etching gas of the third interlayer insulating film 15 and the fourth interlayer insulating film 20, both are made of $SiO_2$. Since the first silicon nitride film 14 and the second silicon nitride film 19 can function as an etching stopper layer in etching the third interlayer insulating film 15 and the fourth interlayer insulating film 20 under these conditions, the first copper wiring 13 is in no way exposed.

During the formation of the second wiring recess 43 and the via hole 42, the silicon compound as the reaction product 44 is generated and stuck onto the side wall of the window 41a of the resist 41.

Then, the mixed gas of $O_2$ and $N_2$ is plasmanized by the ashing equipment, and then the ashing of the resist 41 is performed by the plasma gas. Since no fluorine compound gas is contained in this ashing gas, the second silicon nitride film 19 exposed from the second wiring recess 43 and the via hole 42 is not etched. Therefore, the first copper wiring 13 formed under the second silicon nitride film 19 is not exposed and thus not oxidized.

However, since no fluorine is contained in the ashing gas of the resist 41, the reaction product (silicon compound) 44 which is stuck onto the inner surface of the window 41a in the resist 41 at the time of ashing is not etched and thus still remains.

Figure 9D:
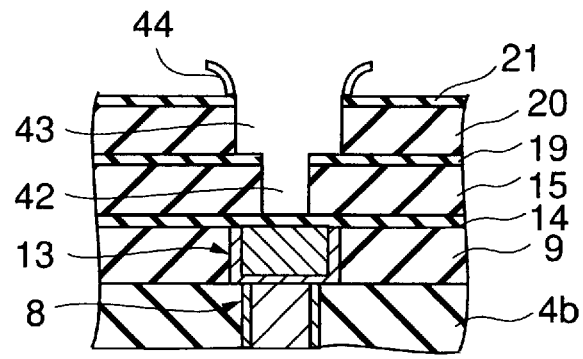

Accordingly, as shown in FIG. 9D, after the ashing of the resist 41, the reaction product 44 generated in the neighborhood of the second wiring recess 43 remains like the fence.

Figure 9E:
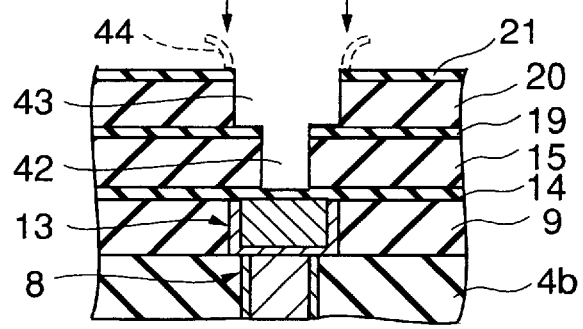

Therefore, the silicon substrate 1 is returned into the RIE equipment 200. Then, as shown in FIG. 9E, the mixed gas of Ar and $O_2$ is plasmanized to thus remove the fence-like reaction product 44.

Since the fluorine compound gas is not employed in removing the reaction product 44, the second silicon nitride film 19 formed under the second wiring recess 43 is not etched, so that the first copper wiring 13 is not exposed and thus not oxidized. As a result, no unevenness is generated on the side walls of the via hole 42 and the second wiring recess 43.

Figure 9F:
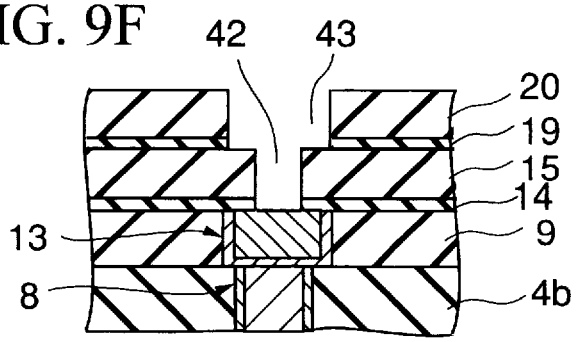

After this, a mixed gas of $CHF_3$, Ar, and $O_2$ is introduced into the chamber 201. As shown in FIG. 9F, the first silicon nitride film 14 and the second silicon nitride film 19 located under the second wiring recess 43 and the via hole 42 are removed by etching them. At this time, the reflection preventing film 21 made of silicon nitride is etched simultaneously to expose the fourth interlayer insulating film 20. In this case, because the reaction product 44 is not left on the reflection preventing film 21, the etching of the reflection preventing film 21 is never blocked by the reaction product 44.

Thereafter, like the first embodiment, a third tantalum nitride film 45 of 5 nm thickness is formed by the sputter method along inner surfaces of the second wiring recess 43 and the via hole 42 and the upper surface of the fourth interlayer insulating film 20. Then, a copper seed film (not shown) is formed on the third tantalum nitride film 45. In addition, a third copper film 46 is formed on the third tantalum nitride film 45 by the electrolytic plating method. Since no reaction product remains on the fourth interlayer insulating film 20 when these metal films 45, 46 are formed, such metal films 45, 46 are hard to peel off.

Figure 9G:
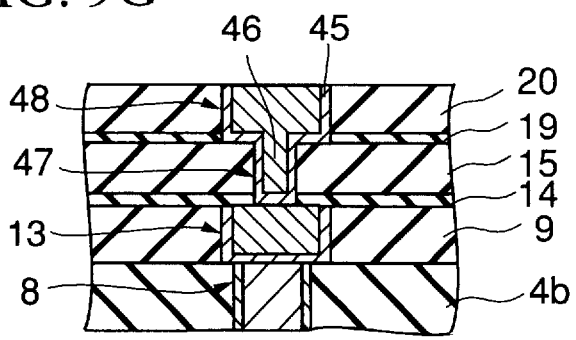

Then, as shown in FIG. 9G, the third copper film 46 and the third tantalum nitride film 45 are removed from the upper surface of the fourth interlayer insulating film 20 by polishing them by means of the CMP method.

Thereby, a second via 47 is composed of the third copper film 46 and the third tantalum nitride film 45, both are left in the via hole 42, and also a second copper wiring 48 is composed of the third copper film 46 and the third tantalum nitride film 45, both are left in the second wiring recess 46.

Fifth Embodiment

In a fifth embodiment, steps of forming the via and the copper wiring by the dual damascene method which is different from that in the third and fourth embodiments will be explained hereinbelow.

FIGS. 10A to 10H are sectional views showing steps of forming a multi-layered wiring of a semiconductor device according to a fifth embodiment of the present invention. Although the explanation about constituent elements positioned under the first interlayer insulating film 4b will be omitted hereunder in the fifth embodiment, it is similar to the first embodiment that the insulating protection film 4a, the MOS transistor 3, and the silicon substrate 1 are covered with the first interlayer insulating film 4b.

At first, like the first embodiment, the first via 8 is formed in the first interlayer insulating film 4b and also the first copper wiring 13 is formed in the second interlayer insulating film 9.

Figure 10A:
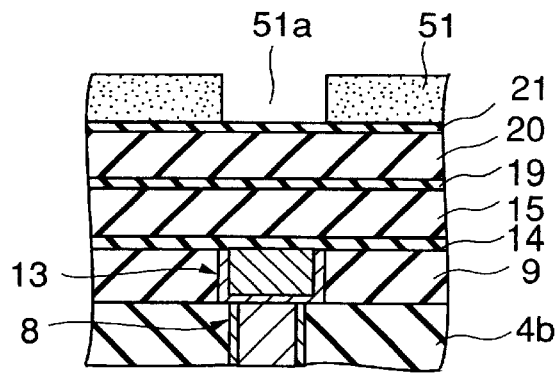
FIGS. 10A to 10H are sectional views showing steps of forming a multi-layered wiring of a semiconductor device according to a fifth embodiment of the present invention.

Then, as shown in FIG. 10A, the first silicon nitride film 14, the third interlayer insulating film. 15, the second silicon nitride film 19, the fourth interlayer insulating film 20, and the reflection preventing film 21 are formed in sequence on the first copper wiring 13 and the second interlayer insulating film 9 by the plasma CVD method. Respective films from the first silicon nitride film 14 to the reflection preventing film 21 may be formed successively by the same CVD equipment. Also, formation of the via is not performed during the film formation from the first silicon nitride film 14 to the reflection preventing film 21.

Then, photoresist 51 is coated on the reflection preventing film 21, and then a wiring pattern window 51a having a wiring shape is formed by exposing/developing the photoresist 51.

Figure 10B:
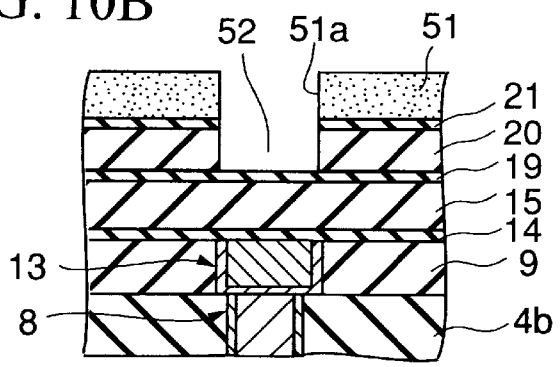

Thereafter, as shown in FIG. 10B, a second wiring recess 52 is formed by successively etching the reflection preventing film 21 and the fourth interlayer insulating film 20 via the wiring pattern window 51a by using the parallel plate type RIE equipment 200. In this case, a mixed gas of $CHF_3$, Ar, and $O_2$, for example, is used as an etching gas of the reflection preventing film 21 made of silicon nitride, and a mixed gas of $C_4F_8$, Ar, $O_2$, and CO, for example, is used as an etching gas of the fourth interlayer insulating film 20 made of $SiO_2$.

The second silicon nitride film 19 can function as an etching stopper layer in etching the fourth interlayer insulating film 20. In this case, if the formation of the second silicon nitride film 19 is omitted, a depth of the second wiring recess 52 can be adjusted by controlling an etching time of the fourth interlayer insulating film 20.

After such second wiring recess 52 has been formed, the mixed gas of $O_2$ and $N_2$ is plasmanized by the ashing equipment and then the ashing of the resist 51 is performed by the plasma gas.

However, since no fluorine is contained in the ashing gas of the resist 41, the reaction product (silicon compound) 44 which is stuck onto the inner surface of the window 51a in the resist 51 at the time of ashing is not etched and thus still remains. The second silicon nitride film 19 which is exposed from the second wiring recess 52 is not etched.

Figure 10C:
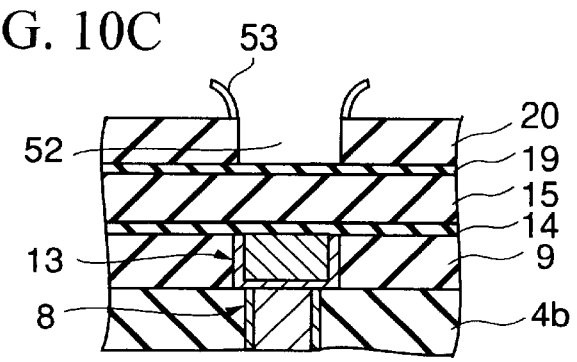
Figure 10D:
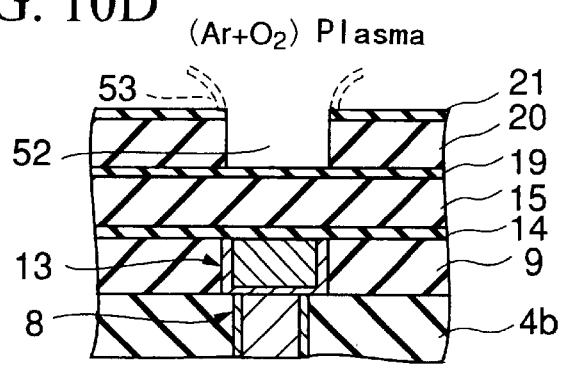

Accordingly, as shown in FIG. 10C, after the ashing of the resist 41, the reaction product 53 remains like the fence in the neighborhood of the second wiring recess 52. Therefore, as shown in FIG. 10D, prior to the etching of the second silicon nitride film 19, the mixed gas of Ar and $O_2$ is plasmanized to remove the fence-like reaction product 53.

Since the fluorine compound gas is not employed in removing the reaction product 53, no unevenness is generated on the side wall of the second wiring recess 52.

Figure 10E:
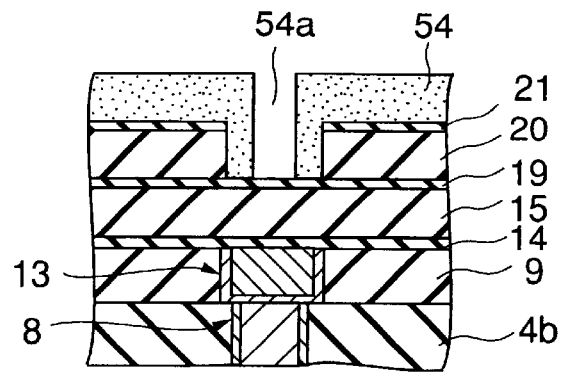

After this, as shown in FIG. 10E, photoresist 54 is coated on the reflection preventing film 21 and in the second wiring recess 52. Then, a via forming window 54a is formed in a part of an overlapping region of the first copper wiring 13 and the second wiring recess 52 by exposing/developing the photoresist 54.

Figure 10F:
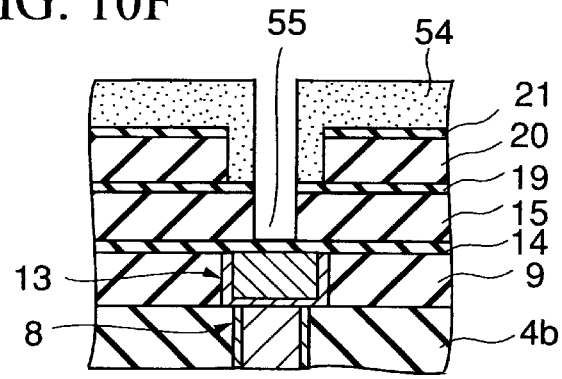

Then, the silicon substrate 1 is returned into the RIE equipment 200. Then, as shown in FIG. 10F, a via hole 55 is formed by etching the second silicon nitride film 19 located under the window 54a by using a mixed gas of $CHF_3$, Ar, and $O_2$ and by etching the third interlayer insulating film 15 by using a mixed gas of $C_4F_8$, Ar, $O_2$, and CO in the chamber 201. Since an amount of etched third interlayer insulating film is small in the step of forming the via hole 55, an amount of the silicon compound stuck onto the side wall of the window 54a of the resist 54 and therefore the silicon compound is difficult to remain like the fence.

According to the etching conditions of the third interlayer insulating film 15, since an etching rate of the first silicon nitride film 14 is small, the first silicon nitride film 14 has a function as the etching stopper layer.

Then, the ashing of the resist 54 is performed by using a plasmanized mixed gas of $O_2$ and $N_2$. Since the fluorine compound gas is not contained in the ashing gas, the second silicon nitride film 19 exposed from the second wiring recess 52 is not etched. Since the silicon compound stuck onto the resist 54 is removed simultaneously in this ashing, the reaction product is never left on the second silicon nitride film 19 like the fence.

Figure 10G:
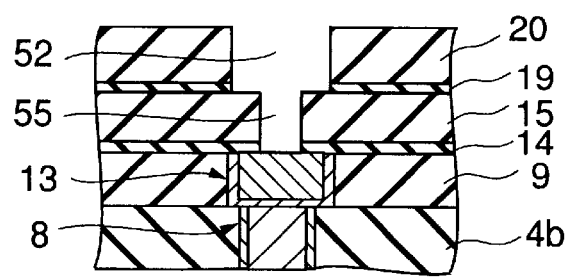

Then, as shown in FIG. 10G, the second silicon nitride film 19 located under the second wiring recess 52 and the first silicon nitride film 14 existing under the via hole 55 are etched by the RIE method using a mixed gas of $CHF_3$, Ar, and $O_2$, whereby a part of the first copper wiring 13 is exposed. At this time, the reflection preventing film 21 made of silicon nitride is etched simultaneously to expose the fourth interlayer insulating film 20.

Figure 10H:
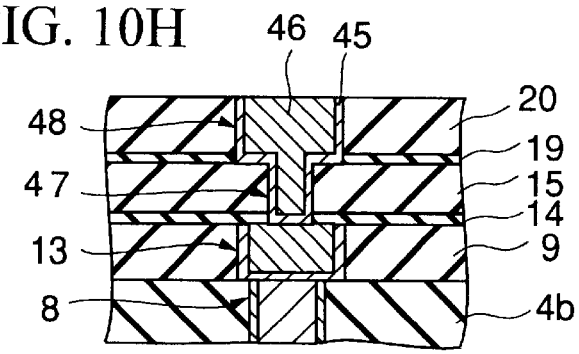

Thereafter, as shown in FIG. 10H, according to the same method as the fourth embodiment, a second via 47 is formed in the via hole 55 and also a second copper wiring 48 is formed in the second wiring recess 52.

Sixth Embodiment

In a sixth embodiment, steps of forming the via and the copper wiring by the dual damascene method which is different from that in the above embodiments will be explained hereinbelow.

FIGS. 11A to 11F are sectional views showing steps of forming a multi-layered wiring of a semiconductor device according to a sixth embodiment of the present invention. Although the explanation about constituent elements positioned under the first interlayer insulating film 4b will be omitted hereunder in the sixth embodiment, it is similar to the first embodiment that the insulating protection film 4a, the MOS transistor 3, and the silicon substrate 1 are covered with the first interlayer insulating film 4b.

Figure 11A:
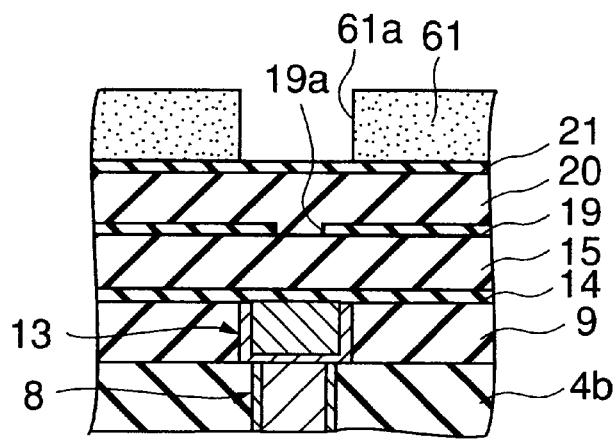
FIGS. 11A to 11F are sectional views showing steps of forming a multi-layered wiring of a semiconductor device according to a sixth embodiment of the present invention.
Figure 11B:
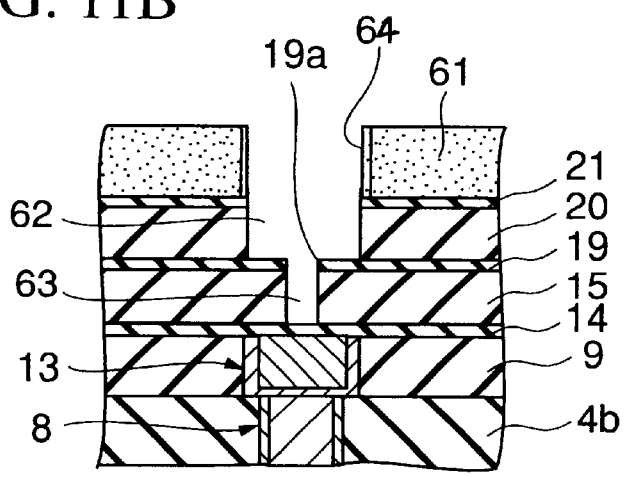

First, as shown in FIG. 11A, like the first embodiment, the first via 8 is formed in the first interlayer insulating film 4b and also the first copper wiring 13 is formed in the second interlayer insulating film 9.

Then, the first silicon nitride film 14, the third interlayer insulating film 15, and the second silicon nitride film 19 are formed in sequence on the first copper wiring 13 and the second interlayer insulating film 9 by the plasma CVD method.

Then, a via-shaped opening 19a is formed over the first copper wiring 13 by patterning the second silicon nitride film 19 by virtue of the photolithography method. Then, the fourth interlayer insulating film 20 and the reflection preventing film 21 are formed in sequence in the opening 19a and on the second silicon nitride film 19 by the plasma CVD method.

Then, photoresist 61 is coated on the reflection preventing film 21, and then a wiring pattern window 61a having a wiring shape is formed by exposing/developing the photoresist 61.

Then, with the use of the parallel plate type RIE equipment 200, the reflection preventing film 21 is etched via the wiring pattern window 61a, then the fourth interlayer insulating film 20 is etched, and then the third interlayer insulating film 15 under the opening 19a is successively etched. Thus, as shown in FIG. 18B, a second wiring recess 62 is formed in the reflection preventing film 21 and the fourth interlayer insulating film 20. At the same time, a via hole 63 which has the same diameter as the opening 19a is formed in the second silicon nitride film 19 and the third interlayer insulating film 15.

In this case, a mixed gas of $CHF_3$, Ar, and $O_2$, for example, is used as an etching gas of the reflection preventing film 21 and the second silicon nitride film 19, and also a mixed gas of $C_4F_8$, Ar, $O_2$, and CO, for example, is used as an etching gas of the third interlayer insulating film 15 and the fourth interlayer insulating film 20, both are made of $SiO_2$. Since the first silicon nitride film 14 and the second silicon nitride film 19 can function as an etching stopper layer in etching the third interlayer insulating film 15 and the fourth interlayer insulating film 20 under the conditions, the first copper wiring 13 is in no way exposed.

During the formation of the second wiring recess 62 and the via hole 63, the silicon compound as the reaction product 64 is generated and stuck onto the side wall of the window 61a of the resist 61.

Then, the mixed gas of $O_2$ and $N_2$ is plasmanized by the plasma generating equipment, and then the ashing of the resist 61 is performed by this plasma gas. Since no fluorine compound gas is contained in this ashing gas, the second silicon nitride film 19 exposed from the second wiring recess 62 and the via hole 63 is not etched. Therefore, the first copper wiring 13 formed under the second silicon nitride film 19 is not exposed and thus not oxidized.

However, since no fluorine is contained in the ashing gas of the resist 61, the reaction product (silicon compound) 64 which is stuck onto the inner surface of the window 61a in the resist 61 at the time of ashing is not etched and thus still remains.

Figure 11C:
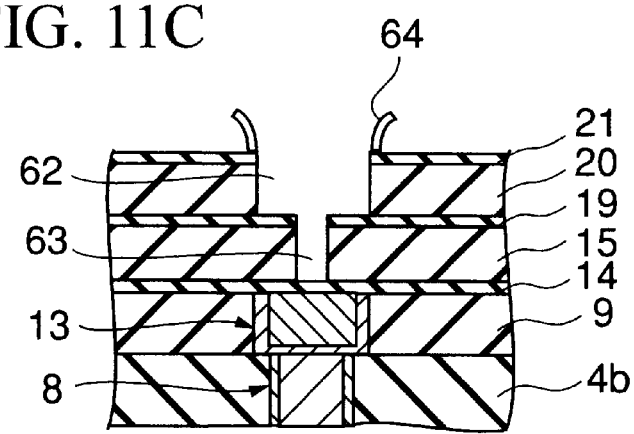
Figure 11D:
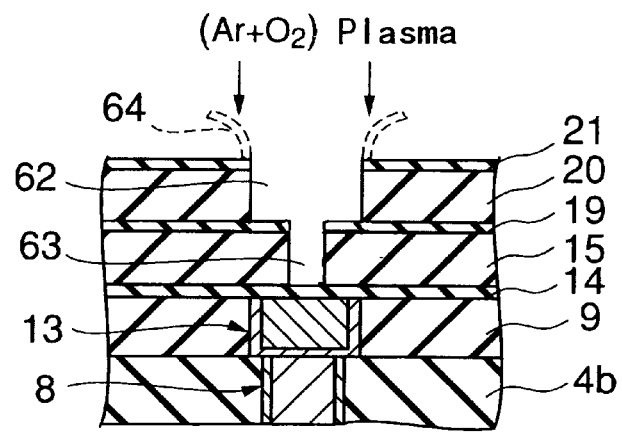

Accordingly, as shown in FIG. 11C, after the ashing of the resist 61, the reaction product 64 generated in the neighborhood of the second wiring recess 62 remains like the fence. Therefore, as shown in FIG. 11D, before the first copper wiring 13 is exposed by etching the second silicon nitride film 19, the fence-like reaction product 64 is thus removed by plasmanizing the mixed gas of Ar and $O_2$.

Since the fluorine compound gas is not employed in removing the reaction product 64, the second silicon nitride film 19 formed under the via hole 63 is not etched. As a result, the first copper wiring 13 is not exposed and thus not oxidized, and thus no unevenness is generated on the side walls of the via hole 63 and the second wiring recess 62.

Figure 11E:
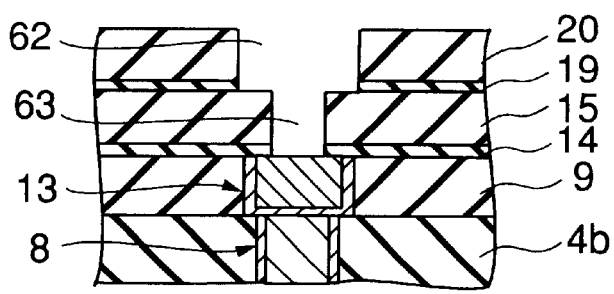

After this, as shown in FIG. 11E, the first silicon nitride film 14 and the second silicon nitride film 19 located under the second wiring recess 62 and the via hole 63 are removed by etching them by using the plasma of the mixed gas of $CHF_3$, Ar, and $O_2$. At this time, the reflection preventing film 21 made of silicon nitride is etched simultaneously to expose the fourth interlayer insulating film 20. In this case, because the reaction product 64 is not left on the reflection preventing film 21, the etching of the reflection preventing film 21 is never blocked by the reaction product 64.

Figure 11F:
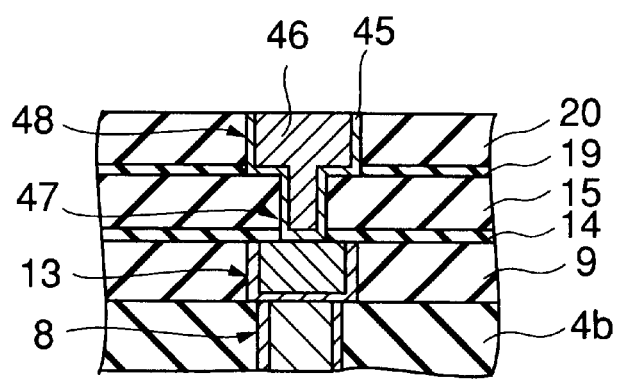

Thereafter, as shown in FIG. 11F, according to the same method as the fourth embodiment, the second via 47 is formed in the via hole 55 and also the second copper wiring 48 is formed in the second wiring recess 52.

Seventh Embodiment

In the above embodiments, although $SiO_2$ is employed as the interlayer insulating film, another silicon compound such as PSG, SiOF, SOG, and others may be employed.

Therefore, while using a multi-layered structure consisting of a fluorine containing silicon oxide film such as SiOF and an $SiO_2$ film as an interlayer insulating film, removal of the fence-like reaction product generated in forming the wiring recess in the interlayer insulating film will be explained hereunder.

Figure 12A:
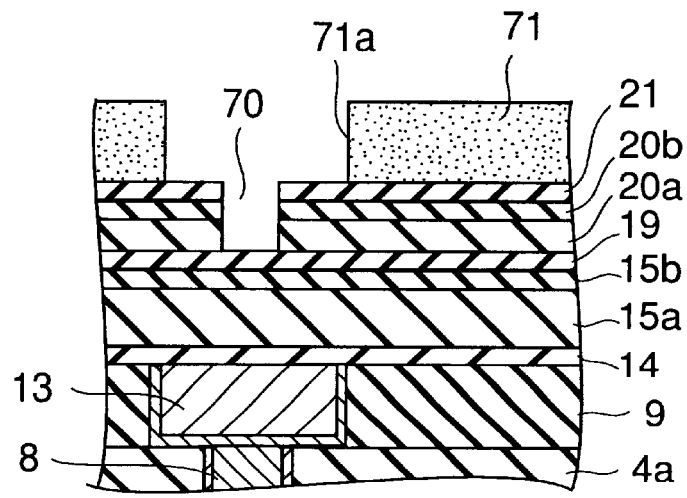
FIGS. 12A to 12C are sectional views showing steps of forming a multi-layered wiring of a semiconductor device according to a seventh embodiment of the present invention.
Figure 12B:
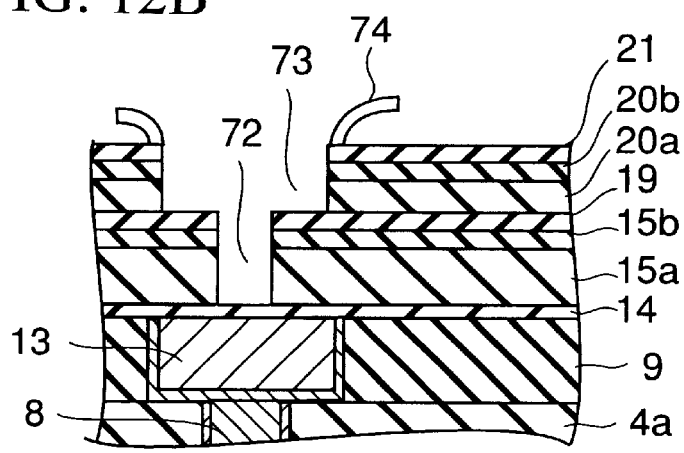
Figure 12C:
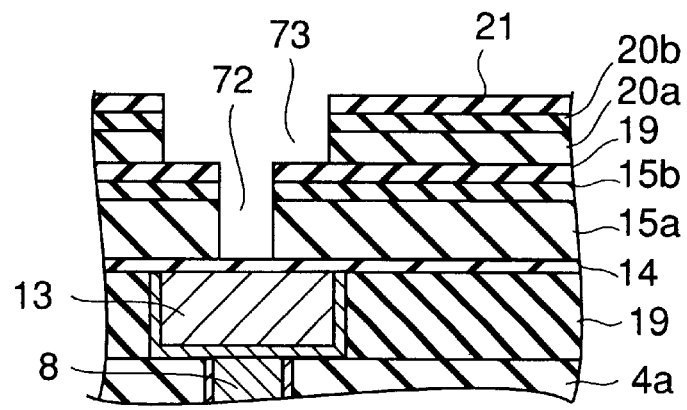

FIGS. 12A to 12C are sectional views showing steps of forming a multi-layered wiring of a semiconductor device according to a seventh embodiment of the present invention.

First, like the first embodiment, the first via 8 is formed in the first interlayer insulating film 4b and also the first copper wiring 13 is formed in the second interlayer insulating film 9. Then, the first silicon nitride film 14 is formed on the first copper wiring 13 and the second interlayer insulating film 9 by the plasma CVD method.

Then, as shown in FIG. 12A, a third interlayer insulating film 15a made of SiOF, a fourth interlayer insulating film 15b made of $SiO_2$, the second silicon nitride film 19, a fifth interlayer insulating film 20a made of SiOF, a sixth interlayer insulating film 20b made of $SiO_2$, and the reflection preventing film 21 made of silicon nitride are formed in sequence by the plasma CVD method. In addition, a via forming opening 70 is formed in a region, which overlaps with the first copper wiring 13, by patterning the reflection preventing film 21, the fifth interlayer insulating film 20a, and the sixth interlayer insulating film 20b by means of the photolithography method.

In this case, a mixed gas of $C_4F_8$, Ar, $O_2$, and CO, for example, is used in etching the fourth interlayer insulating film made of SiOF or $SiO_2$, and also a mixed gas of $CHF_3$, Ar, and $O_2$, for example, is used in etching the silicon nitride film.

After this, photoresist 71 is coated on the reflection preventing film 21, and then a wiring pattern window 71a to pass over the opening 70 is formed by exposing/developing the photoresist 71.

Then, when a plurality of films from the reflection preventing film 21 to the third interlayer insulating film 15a are etched successively via the wiring pattern window 71a and the opening 70, a second wiring recess 73 is formed in the reflection preventing film 21, the fifth interlayer insulating film 20a, and the sixth interlayer insulating film 20b. At the same time, a via hole 72 which has the same diameter as the opening 70 is formed in the second silicon nitride film 19, the third interlayer insulating film 15a, and the fourth interlayer insulating film 15b.

In this case, if the mixed gas of $C_4F_8$, Ar, $O_2$, and CO, for example, is employed as the etching gas of the interlayer insulating film made of SiOF or $SiO_2$, the first silicon nitride film 14 and the second silicon nitride film 19 can function as the etching stopper layer. As a result, the first copper wiring 13 is never exposed.

During the formation of the second wiring recess 73 and the via hole 72, the silicon compound as the reaction product 74 is generated and adhered onto the side wall of the window 71a of the resist 71.

Then, the mixed gas of $O_2$ and $N_2$ is plasmanized by the ashing equipment, and then the ashing of the resist 71 is performed by using this plasma gas. Since the fluorine compound gas is not contained in the ashing gas, the second silicon nitride film 19 exposed from the second wiring recess 73 and the via hole 72 is not etched. Therefore, the first copper wiring 13 formed under the second silicon nitride film 19 is not exposed and thus not oxidized.

However, because the fluorine is not contained in the ashing gas of the resist 71, the reaction product (silicon compound) 74 which is stuck onto the inner surface of the window 71a of the resist 71 at the time of ashing is not etched and thus remains as it is.

Accordingly, as shown in FIG. 12B, after the ashing of the resist 71, the reaction product 74 is left in the neighborhood of the second wiring recess 73 like the fence. Therefore, as shown in FIG. 12C, before the first copper wiring 13 is exposed by etching the second silicon nitride film 19, the mixed gas of Ar and $O_2$ is plasmanized to thus remove the fence-like reaction product 74.

Since the fluorine compound gas is not used in removing the reaction product 74, the second silicon nitride film 19 formed under the second wiring recess 73 is not etched. As a result, the first copper wiring 13 is neither exposed nor oxidized, and the unevenness is never generated on the insulating film of the multi-layered structure exposed from the via hole 72 and the second wiring recess 73.

Thereafter, the first silicon nitride film 14 and the second silicon nitride film 19 existing under the second wiring recess 73 and the via hole 72 are etched by using a mixed gas of $CHF_3$, Ar, and $O_2$ to remove, and also the reflection preventing film 21 is etched to remove.

Thereafter, like the sixth embodiment, a copper film and a tantalum nitride film are buried in the second wiring recess 73 and the via hole 72 respectively, so that a second copper wiring is formed in the second wiring recess 73 and a via is formed in the via hole 72.

Other Embodiments

The gas used to remove the above reaction product is not limited to the mixed gas of argon (Ar). A single inactive gas such as argon, krypton (Kr), xenon (Xe), and others, or an inactive gas containing at least one inactive gas, or a mixed gas of such inactive gas and a gas other than halogen may be employed. Such gas other than halogen is not limited to oxygen ($O_2$) shown in the above embodiments. At least one of oxygen, nitrogen ($N_2$), helium (He), and neon (Ne) may be selected in addition to the above.

In the above embodiments, $SiO_2$, PSG, SOG, FSG (SiOF), etc. are listed as constituent material of the interlayer insulating film, and a mixed gas of $C_4F_8$, Ar, $O_2$, and CO is employed as the etching gas. In this case, $C_5F_8$ may be used in place of $C_4F_8$, and CO may be omitted.

In addition, a mixed gas of $CHF_3$, Ar, and CO is used as the etching gas of the silicon nitride film, but other inactive gas may be used instead of Ar.

Moreover, in the above embodiments, the copper is used as the metal material buried in the wiring recess and the via. But the metal such as tungsten, aluminum, and others may be used.

As described above, according to the present invention, the wiring recess is formed by etching the insulating film while using the resist as a mask, then the resist is removed, and then the reaction product generated by etching the insulating film is removed by the plasma of the gas except halogen. Therefore, inner surfaces of the wiring recess and the via hole can be prevented from being etched by the halogen gas in removing the reaction product, and thus generation of the unevenness on these inner surfaces can be suppressed. In addition, since the etching stopper film formed under the insulating film can be prevented from being etched by halogen, oxidation of the via or the wiring existing under the etching stopper film can be prevented.

What is claimed is:

1. A method of manufacturing a semiconductor device comprising the steps of:

forming an insulating film over a semiconductor substrate;

coating resist on the insulating film;

forming a wiring pattern window for fabricating a damascene structure in the resist;

forming a wiring recess for fabricating the damascene structure by etching the insulating film via the window, therefore a reaction product is formed on an inner face of the wiring pattern window;

removing the resist from an upper surface ofthe insulating film, wherein there action product remains on the inner face of the wiring pattern window;

removing the reaction product existing on the insulating film after removing the resist by exposing the insulating film to a halogen-free plasma atmosphere using a gas selected from the group consisting of argon (Ar), krypton (Kr) and xenon (Xe); and burying a metal film into the wiring recess.

2. A method of manufacturing a semiconductor device according to claim 1, wherein any one of a mixed gas of an inactive gas and a gas other than halogen and a single inactive gas is introduced into the plasma atmosphere.

3. A method of manufacturing a semiconductor device according to claim 1, wherein the insulating film comprising double-layer films or more, each having different etching property.

4. A method of manufacturing a semiconductor device according to claim 1, wherein the insulating film is formed of silicon compound.

5. A method of manufacturing a semiconductor device according to claim 1, wherein a halogen gas is contained as an etching gas in etching the insulating film.

6. A method of manufacturing a semiconductor device according to claim 1, wherein the metal is composed of at least copper.

7. a method of manufacturing a semiconductor device according to claim 1, wherein the step of removing the reaction product is performed by using a plasma apparatus of a type applying a bias electric power to the semiconductor substrate side.

8. A method of manufacturing semiconductor device comprising the steps of:

forming a first wiring over a semiconductor substrate via a first insulating film;

forming an etching stopper film to cover the first wiring, a second insulating film, and a third insulating film;

forming resist having a wiring pattern window for fabricating a damascene structure, a part of which is overlapped with a region located over the first wiring, on the third insulating film;

forming a wiring recess for fabricating the damascene structure in the third insulating film by etching the third insulating film while using the resist as a mask, wherein a reaction product is formed on an inner face of the wiring pattern window;

removing the resist wherein the reaction product remains on an inner face of the wiring pattern window;

removing the reaction product existing on the third insulating film after removing the resist by exposing the third insulating film to a halogen-free plasma atmosphere using a gas selected from the group consisting of argon (Ar), krypton (Kr) and xenon (Xe) forming a via hole by etching the second insulating film;

removing the first etching stopper film under the via hole; and forming a via and a second wiring by burying a metal film into the via hole and the wiring recess.

9. A method of manufacturing a semiconductor device according to claim 8, wherein any one of a mixed gas of an inactive gas and a gas except halogen and a single inactive gas is introduced into the plasma atmosphere.

10. A method of manufacturing a semiconductor device according to claim 9, further comprising, before formation of the resist, the steps of:

forming the via hole on the first wiring by etching a part of the third insulating film, the first etching stopper film, and the second insulating film; and burying protection material into the via hole; and further comprising the step of:

removing the protection material after formation of the wiring recess.

11. A method of manufacturing a semiconductor device according to claim 8, further comprising, before formation of the resist, the step of:

forming a via hole forming opening over the first wiring by etching a part of the third insulating film.

12. A method of manufacturing a semiconductor device according to claim 8, wherein the via hole is formed by etching a part of the second insulating film after the wiring recess is formed in the third insulating film and the resist is removed.

13. A method of manufacturing a semiconductor device according to claim 8, wherein the gas except the halogen is composed of at least one of nitrogen, oxygen, helium, and neon.

14. A method of manufacturing a semiconductor device according to claim 8, wherein the first to third insulating films are formed of silicon compound.

15. A method of manufacturing a semiconductor device according to claim 8, wherein the metal.

16. A method of manufacturing a semiconductor device according to claim 8, wherein the metal film is composed of at least copper.

17. A method of manufacturing a semiconductor device according to claim 8, wherein the third insulating film is formed of silicon compound.

18. A method of manufacturing a semiconductor device according to claim 8, wherein a halogen gas is contained as an etching gas in etching the third insulating film.

* * * * *